United States Patent [19]
Borrelli et al.

[11] 3,931,506
[45] Jan. 6, 1976

[54] PROGRAMMABLE TESTER

[75] Inventors: Ronald N. Borrelli, Moraga; Douglas W. Raymond, Berkeley, both of Calif.

[73] Assignee: Zehntel, Inc., Concord, Calif.

[22] Filed: Dec. 30, 1974

[21] Appl. No.: 537,563

[52] U.S. Cl. .......................... 235/153 AC; 324/73 R
[51] Int. Cl.[2] .................. G06F 11/00; G01R 31/28
[58] Field of Search ........... 235/153 AC; 340/172.5; 324/73 R

[56] References Cited
UNITED STATES PATENTS

| | | | |
|---|---|---|---|
| 3,423,677 | 1/1969 | Alford et al. | 324/73 R |
| 3,492,571 | 1/1970 | Desler | 324/73 R |
| 3,492,572 | 1/1970 | Jones et al. | 324/73 R |
| 3,541,441 | 11/1970 | Hrustich | 235/153 AC |
| 3,546,582 | 12/1970 | Barnard et al. | 235/153 AC |
| 3,549,996 | 12/1970 | Vaughan | 324/73 R |
| 3,631,229 | 12/1971 | Bens et al. | 325/153 AC |
| 3,763,430 | 10/1973 | Terrey | 324/73 R |

*Primary Examiner*—Charles E. Atkinson
*Attorney, Agent, or Firm*—Flehr, Hohbach, Test, Albritton & Herbert

[57] ABSTRACT

A method and apparatus for automatic, programmed, in-circuit component testing and functional testing. A multi-mode measurement unit having an exciter circuit, computing circuit, and a converter circuit is provided for measuring electrical signals. The measurement unit is controlled by a program-commanded measurement unit controller. A plurality of device connection switches are provided for connecting, by a program-commanded switch controller, the computing circuit to selected nodes of a circuit under test. The switch controller and the measurement unit controller receive commands from a programmed processor which executes stored programs of instruction. The programs contain subroutines which correlate with commanded measurement parameters and sequences within the measurement unit.

25 Claims, 16 Drawing Figures

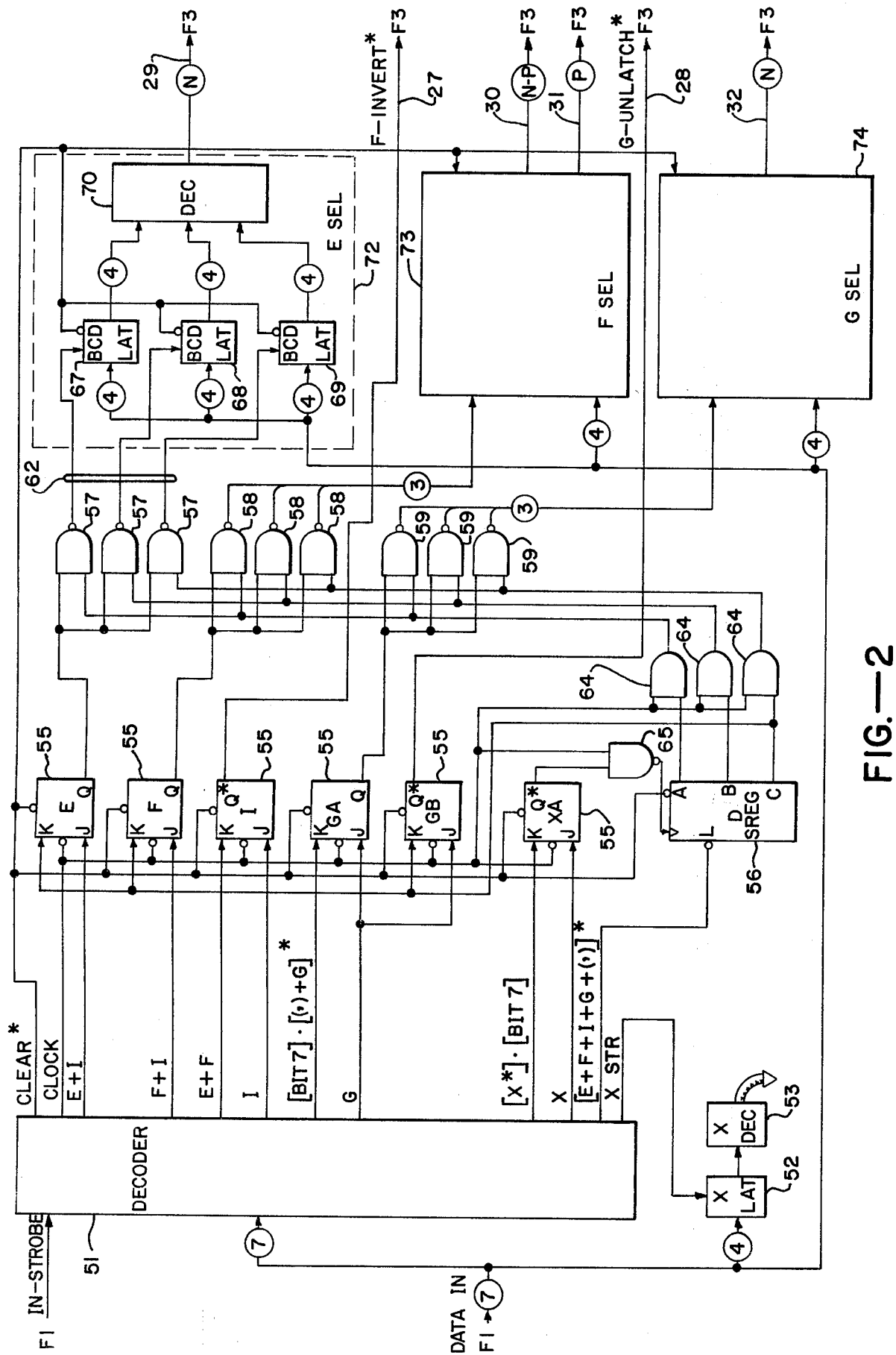
FIG.—2

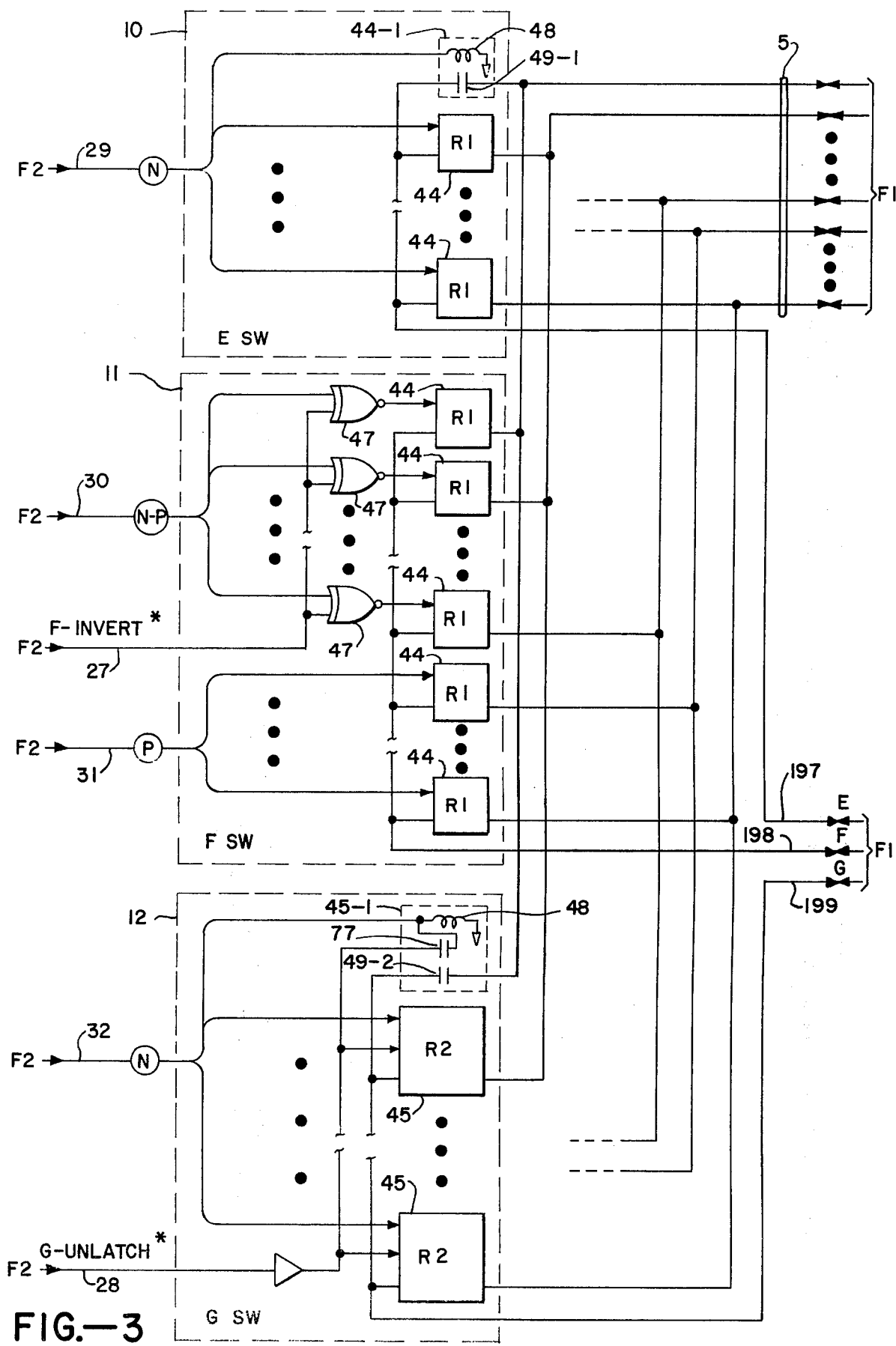
FIG.—3

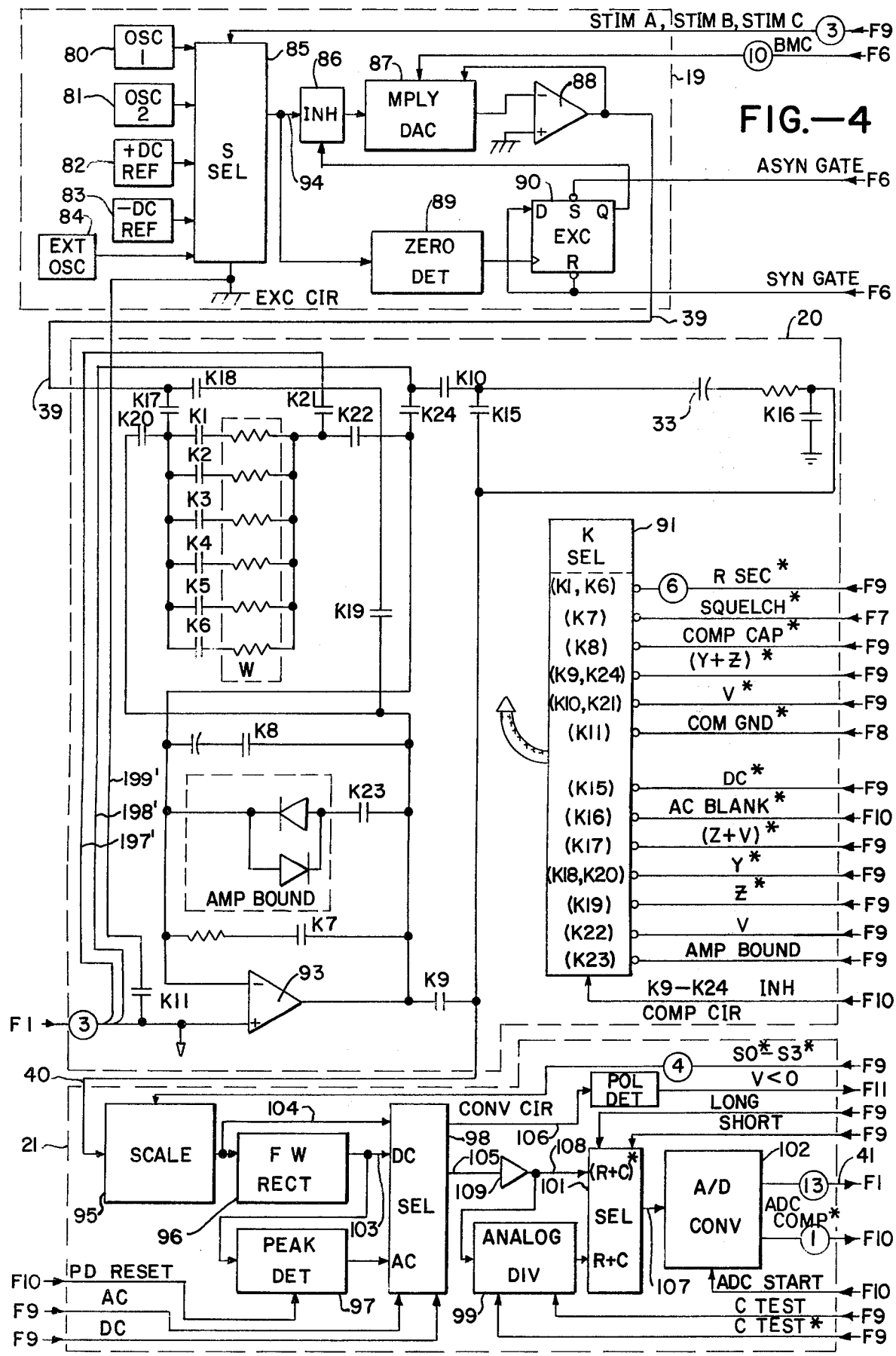

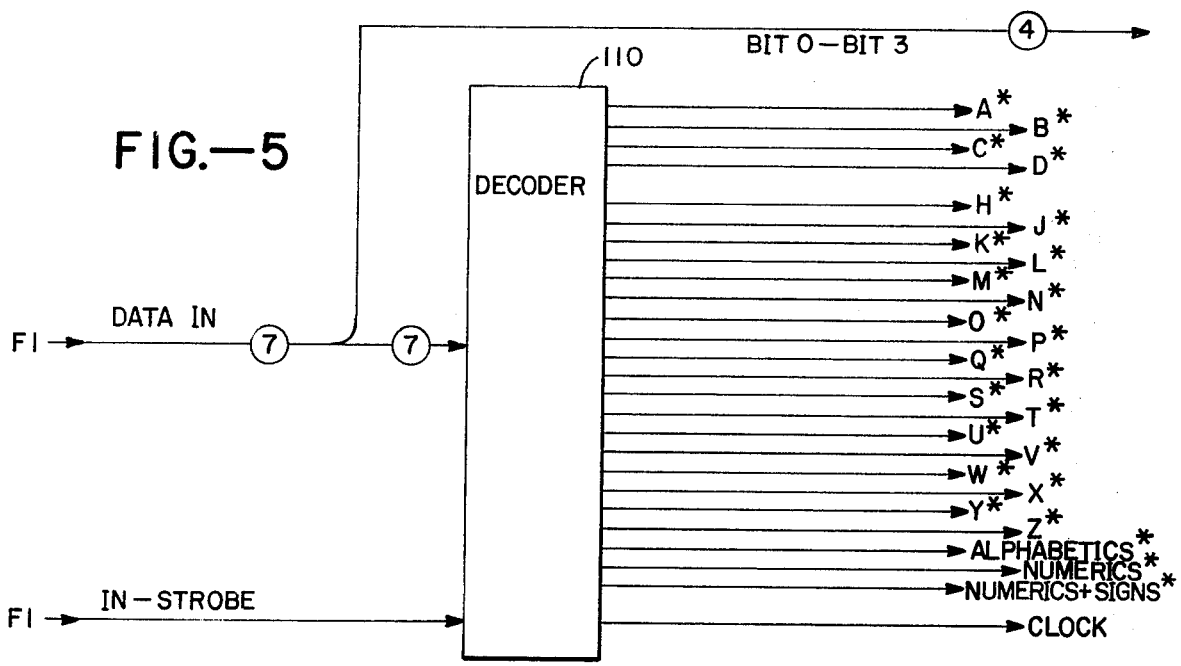
FIG.—5
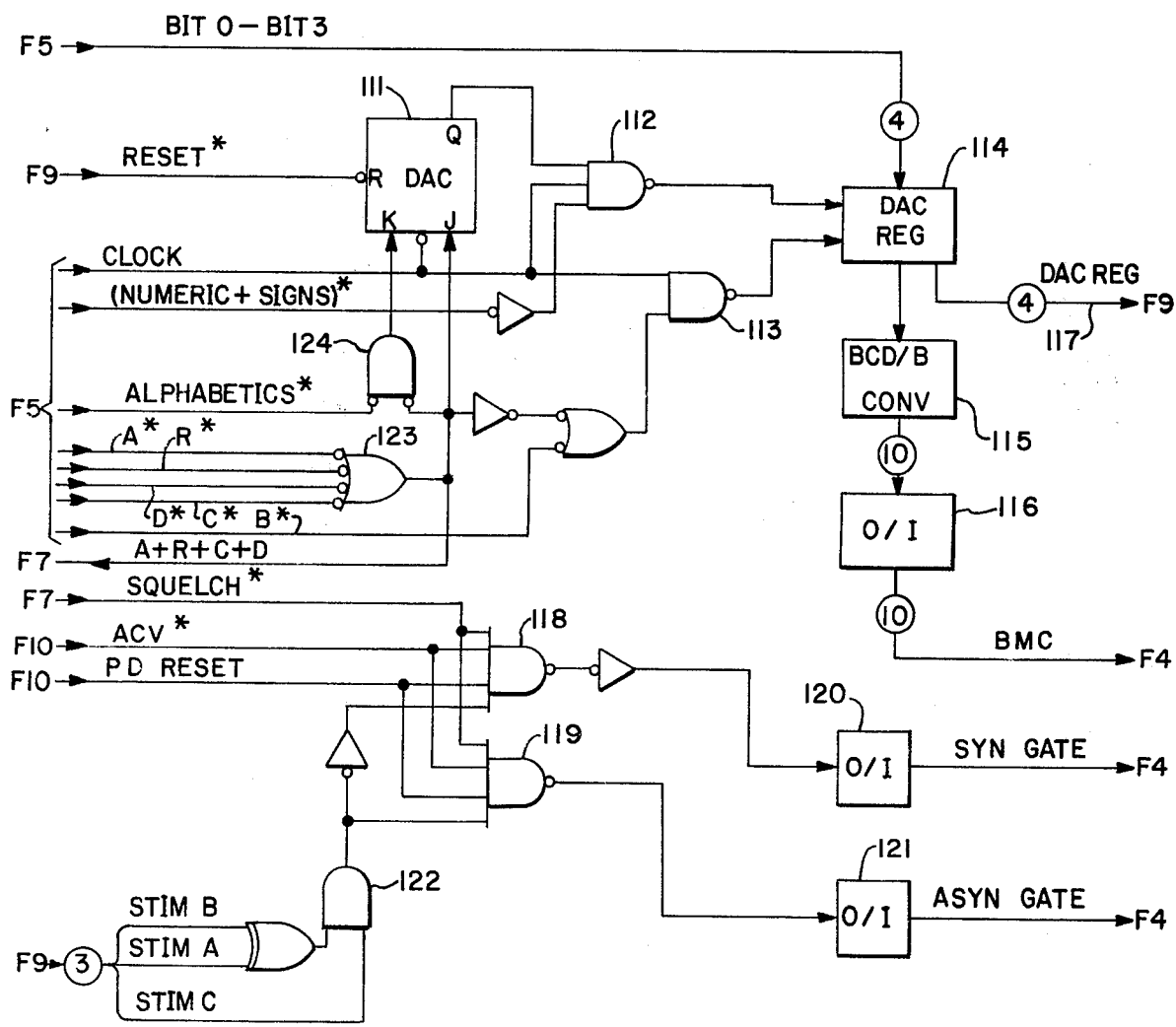
FIG.—6

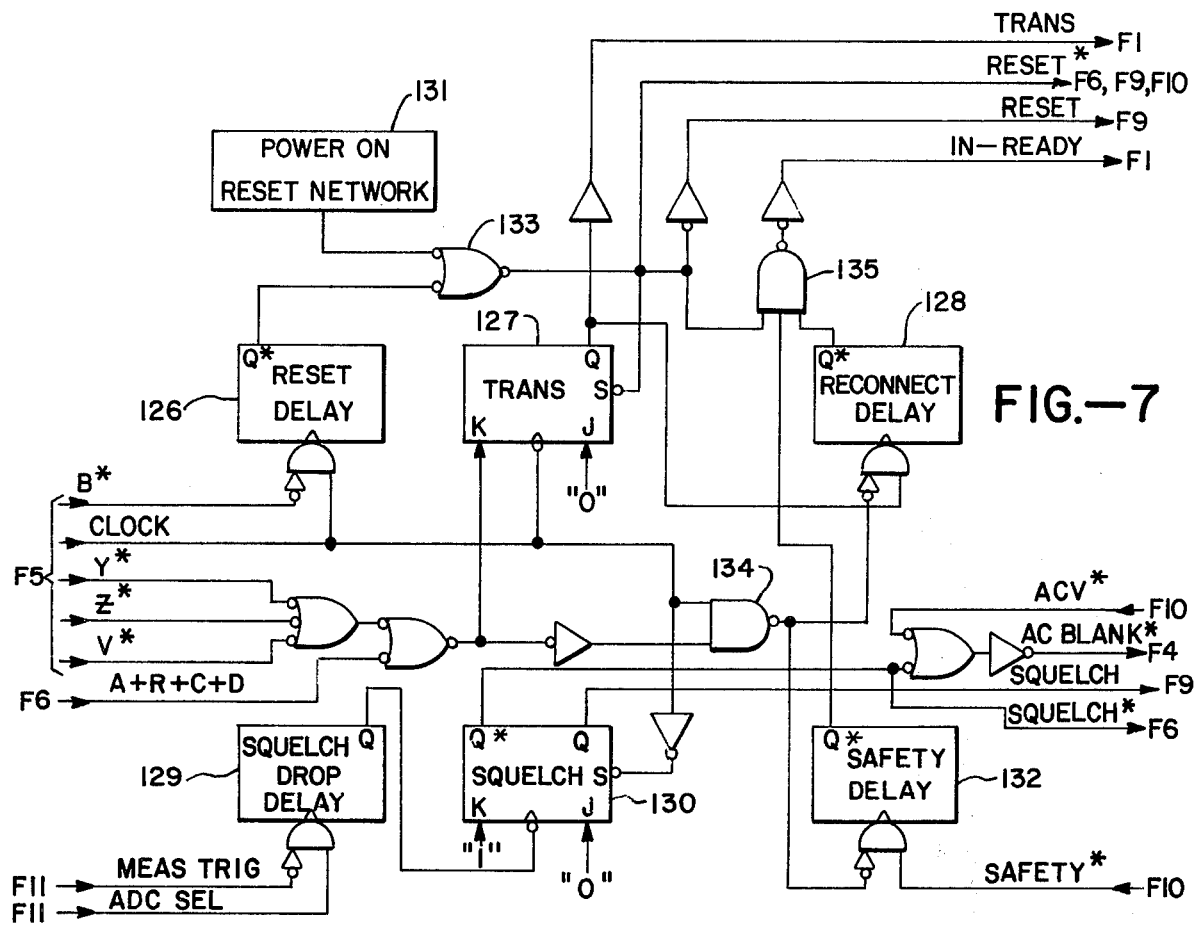
FIG.—7
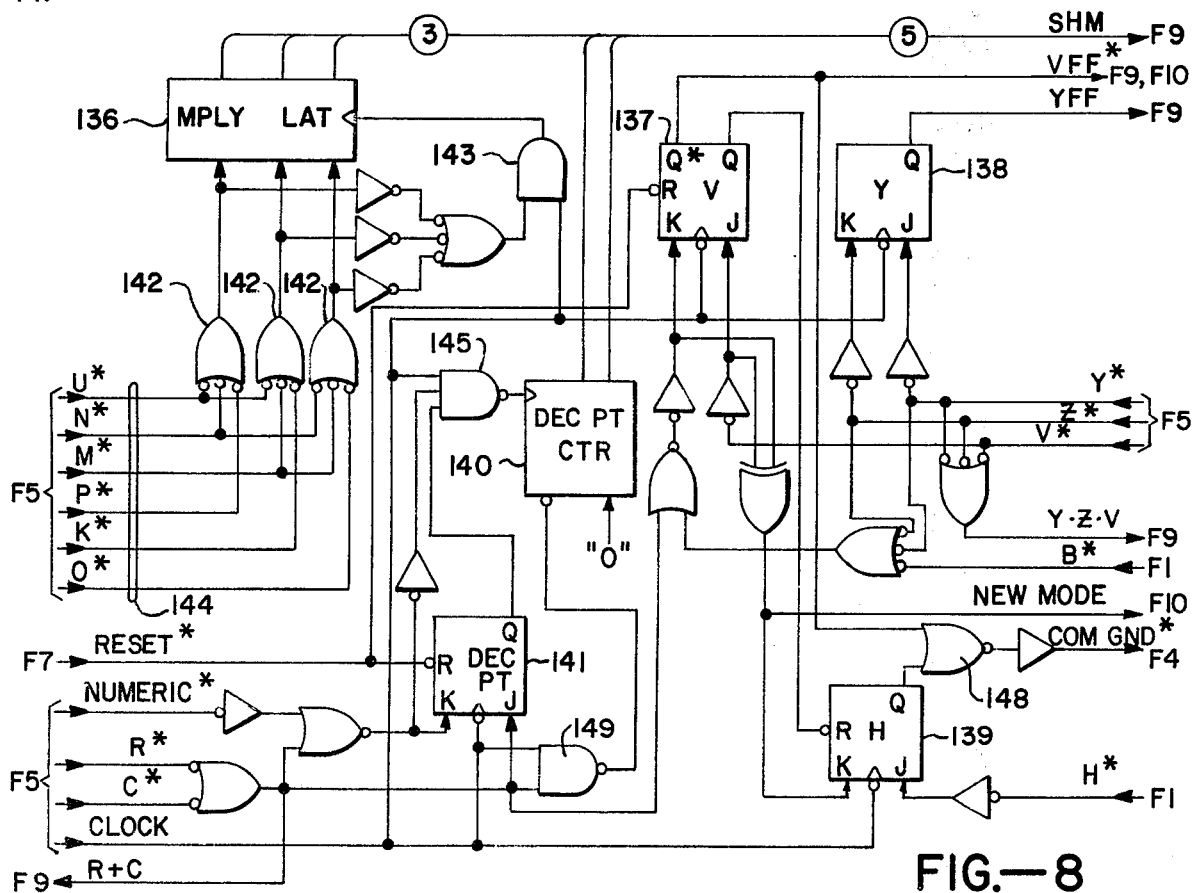
FIG.—8

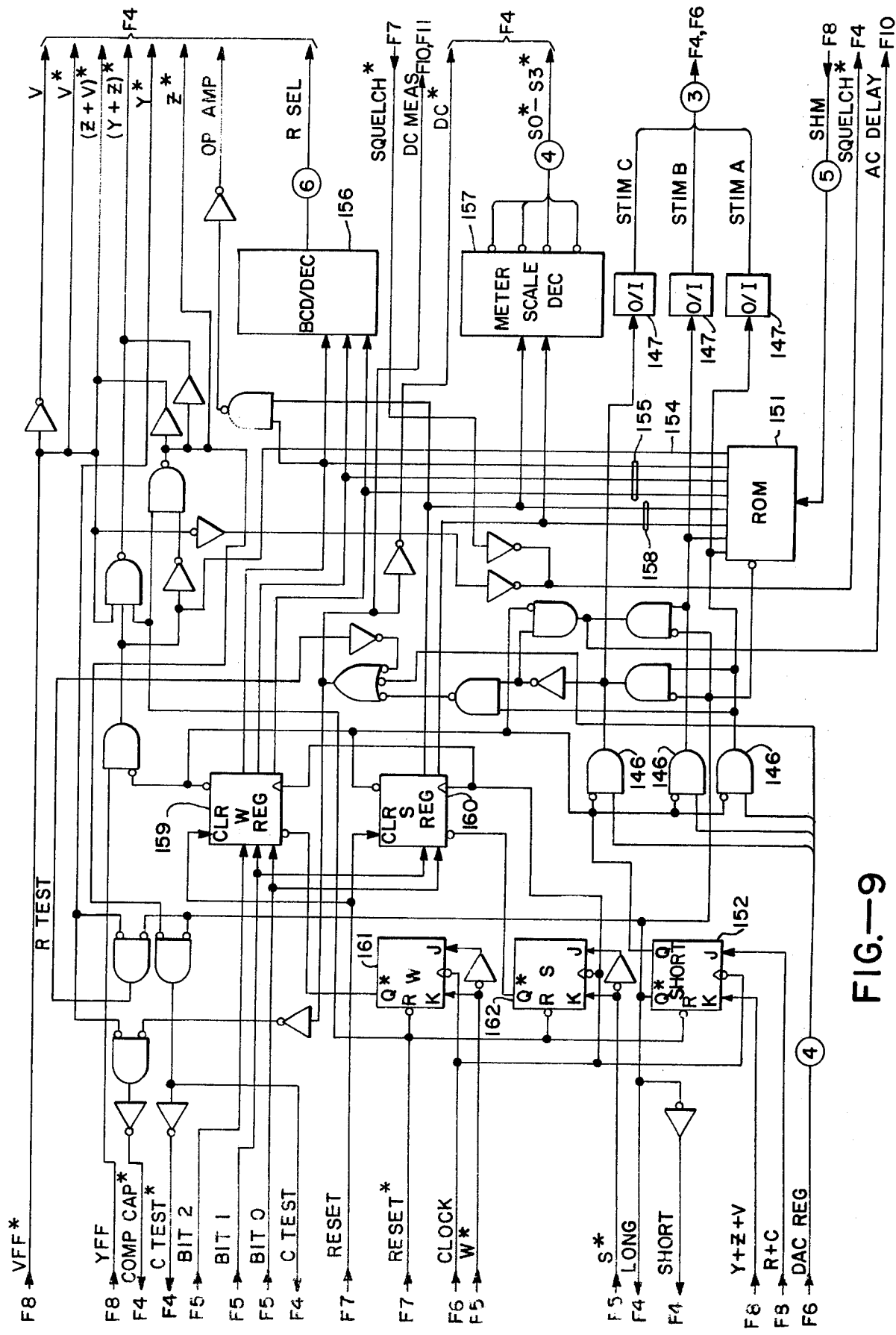
FIG.—9

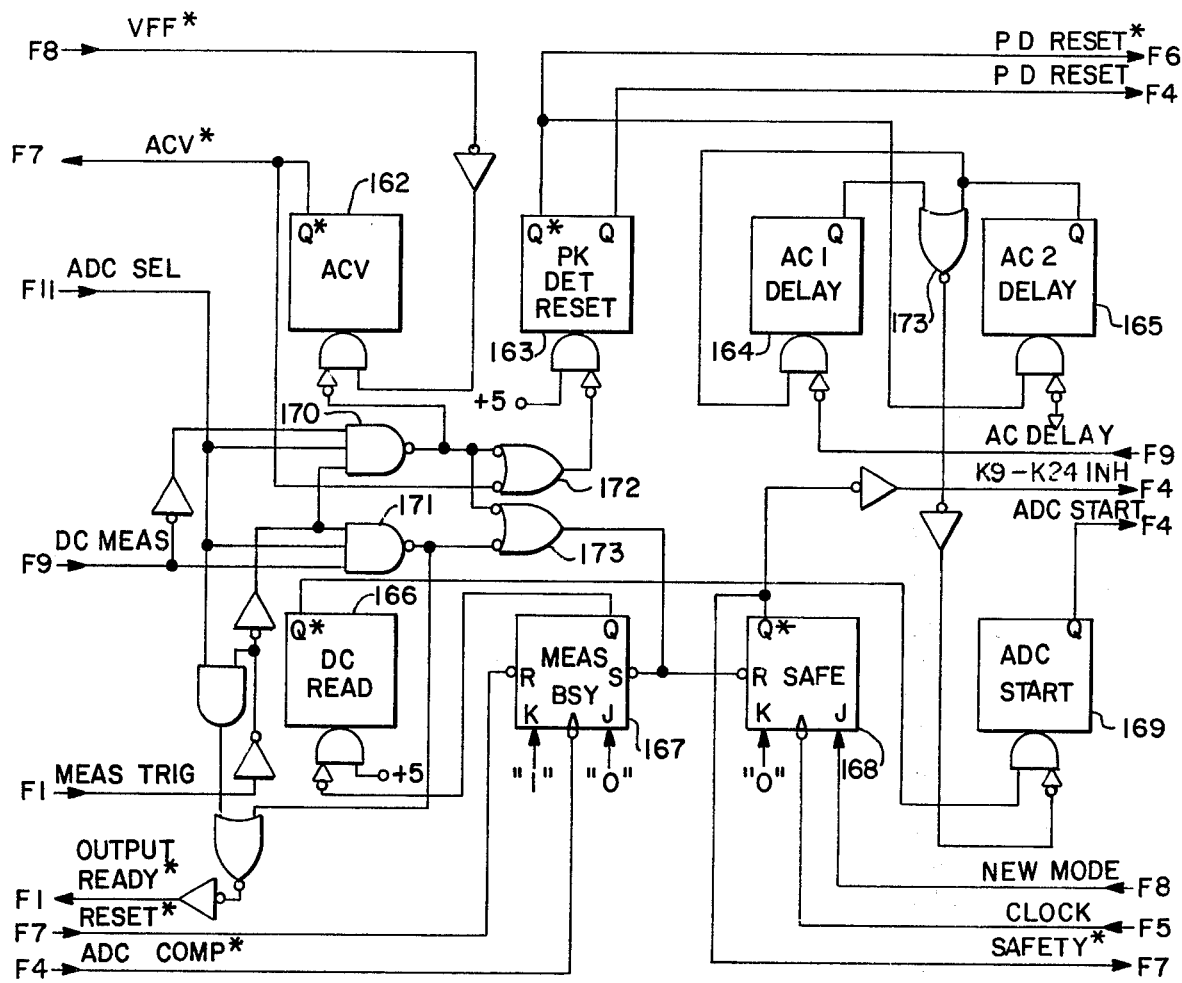
FIG.—10
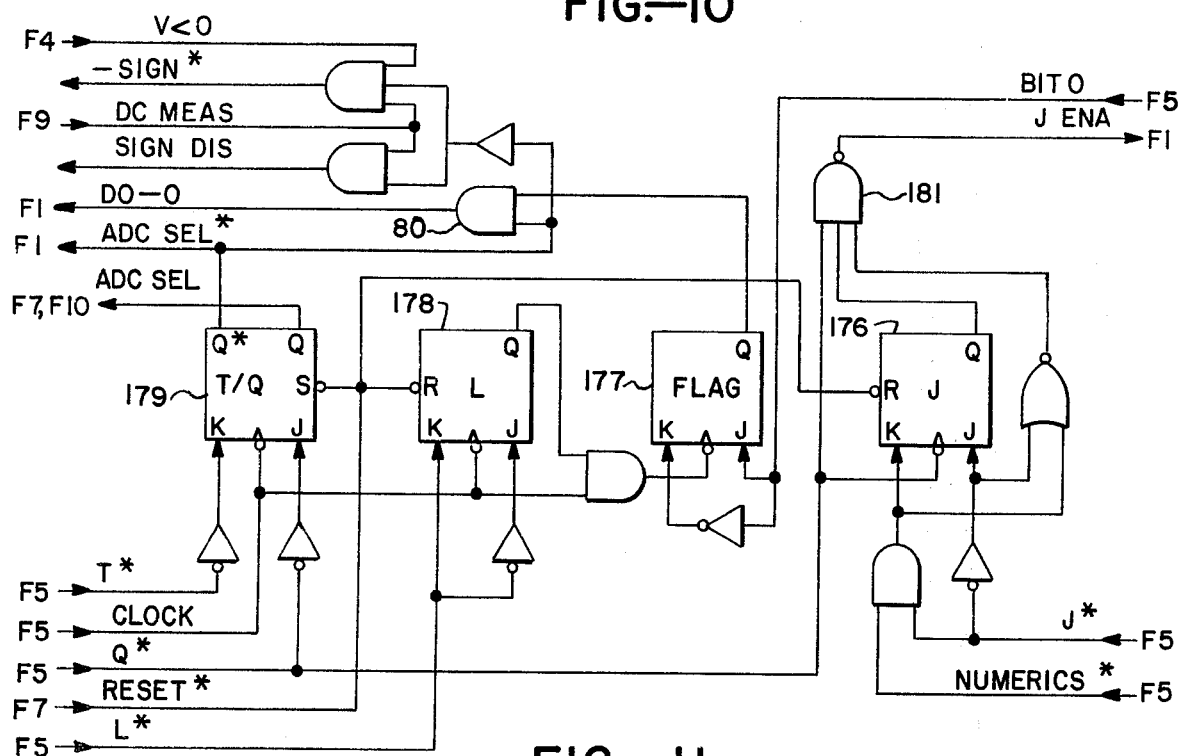
FIG.—11

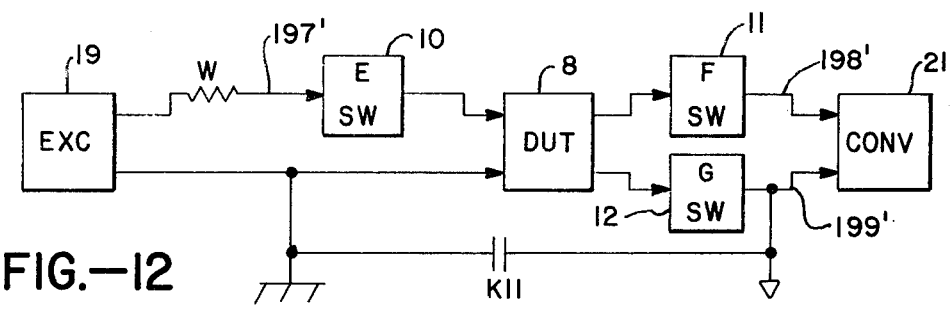
FIG.—12
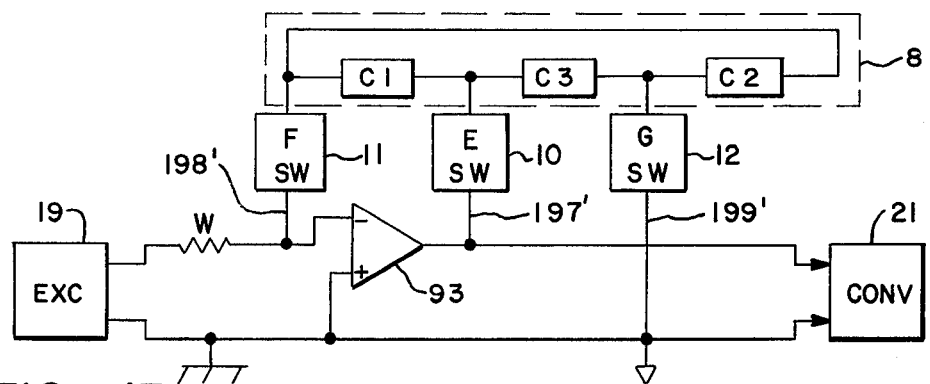
FIG.—13
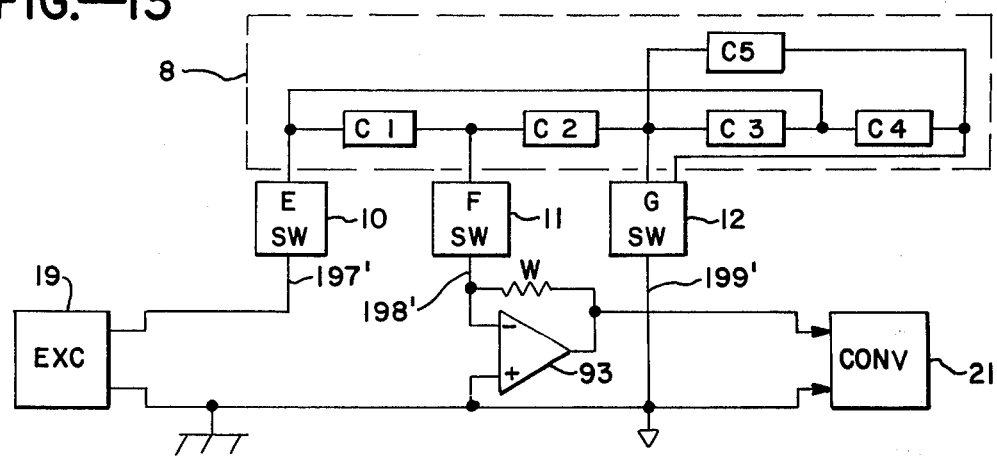
FIG.—14
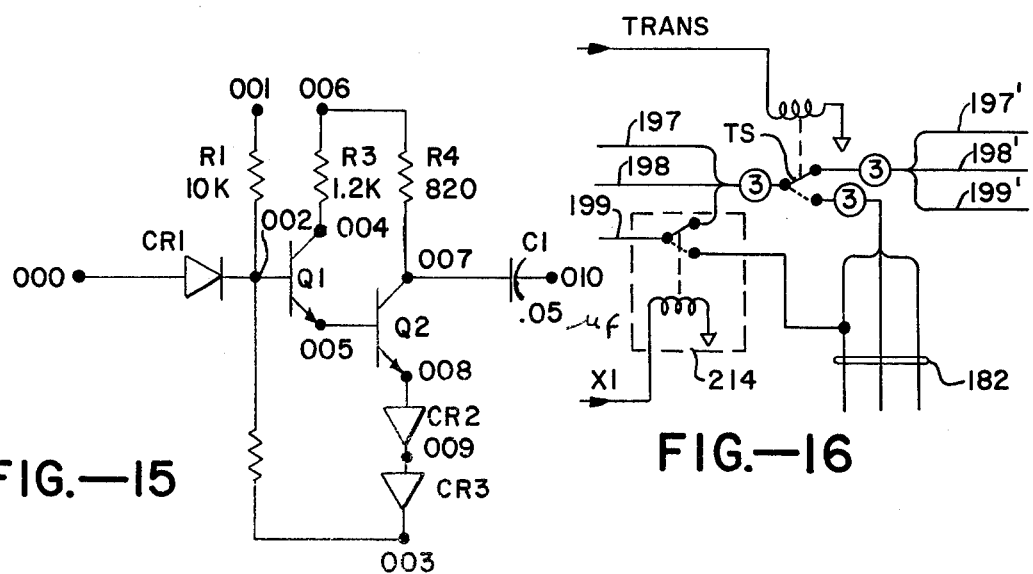
FIG.—15  FIG.—16

PROGRAMMABLE TESTER

CROSS REFERENCE TO RELATED APPLICATION

1. CAPACITOR TEST APPARATUS AND METHOD, Ser. No. 537,253, filed Dec. 30, 1974, invented by Douglas W. Raymond, and assigned to Zehntel, Inc.

BACKGROUND OF THE INVENTION

The present invention relates to measuring and testing methods and apparatus and more particularly to programmable, automatic circuit testers and in-circuit component testers.

The testing of circuits and components may be classified into the general categories of analog and digital testing although distinctions between the categories is at times imprecise.

The category of analog testing refers to excitation with and measurement of signals that are quantitative and continuous in nature. For example, measurements of voltage, current, frequency and time are typically classified as analog measurements. Analog testing is sometimes referred to as dynamic testing when time or some other dynamically variable parameter is involved or is sometimes referred to as static testing when a fixed, non-dynamically variable parameter is involved.

The category of digital testing refers to the examination of logic patterns to determine whether they are binary 1's or 0's without regard to their quantitative values as long as as they fall within gross threshold ranges. Digital testing is sometimes referred to as pattern testing.

Components are building blocks for forming circuits. For example, resistors, capacitors, inductors, delay lines, amplifiers, logical gates, and integrated circuits on semi-conductor chips are all typical components. Components are characterized by having terminals for use in connecting the components into a larger circuit.

Circuits are a plurality of interconnected components which operate to perform functions. The points at which components are connected in a circuit are called nodes. Circuits perform functions by receiving input signals on one or more selected input nodes to produce output signals on one or more selected output nodes. The input and output nodes are called external nodes. The input and output nodes may or may not be the same nodes or either input or output nodes may not be present.

In addition to the input and output (I/O) nodes, circuits typically includes one or more internal nodes which are the connection points for components which are not utilized to conduct input or output signals to or from the circuits. Components such as semiconductor chips typically include component circuits fabricated on a single wafer from a plurality of nondiscrete internal components such as diodes and transistors. Many of the internal nodes within integrated circuit chips typically are not utilized for connection of input or output signals. A limited number of I/O nodes (external nodes) are available from a semiconductor chip for connection of the chip in a larger circuit where the larger circuit typically includes other chips and components. Of course, if desirable, chips, may be constructed with one or more internal nodes having connections which, like I/O nodes, are available for external connection.

The relationship between non-discrete components and a semiconductor chip is the same relationship as between discrete components and a circuit board on which the discrete components are mounted and connected. The I/O nodes (external nodes) on the semiconductor chip and the I/O nodes on a circuit board must be available for connection of signals. The internal nodes of semiconductor chips and of circuit boards are generally not available for making connections. Although circuit boards are more readily adapted, using test fixtures, for connections to internal nodes, semiconductor chips can be designed to make internal nodes available for connection.

The process of functional testing consists of applying at the input terminals of a device under test, (either a circuit or a component) the same signals normally applied in its intended application and determining whether or not the signals on the output terminals are acceptable for normal operation. In digital functional testing, a digital output is examined to determine if it matches the expected pattern of 1's and 0's. In analog functional testing, the output signals are measured so it can be determined if their incremental levels fall within acceptable limits of time, voltage, current or other parameters.

The process of component in-circuit testing consists of testing a component while it is connected in its normal manner within a circuit. The in-circuit testing of a component requires access to the nodes by which the component is interconnected in the circuit. The nodes may be internal or external or both.

Whenever a component is in-circuit tested, special problems arise because of the interaction of the component with the remainder of the circuit to which it is interconnected. Generally, some form of isolation or guarding is required in order to satisfactorily in-circuit test components. Additionally, a judicious selection of the test signals must be made in order to insure that either the component under test or the circuit it is interconnected with is not damaged.

Because of the high number of components and circuits which are manufactured, test equipment to be fully useful and economical must be automated, high-speed, highly reliable, and flexible. Automated testers have been available for the functional testing of circuits and components.

There is a need, however, for improved test apparatus and methods for the automatic, programmed, in-circuit testing of components either alone or in combination with the functional testing of circuits and components.

SUMMARY OF THE INVENTION

The present invention is a method and apparatus for the automatic, programmed, in-circuit testing of components in a circuit under test. A measurement unit having an exciter circuit, a computing circuit, and a converter circuit is provided, which operates in one or more selectable modes, for measuring voltages or currents. The measurement unit operates under control of a measurement unit controller to select the mode and carry out one of a number of test sequences. A plurality of device connection switches are provided for selectively connecting the computing circuit under program control to selected nodes of a circuit on a device under test. The selection of which nodes are connected to the computing circuit is under control of a device connection switch controller. Both the device connection switch controller and the measurement unit controller are in turn controlled by a programmable processor. The programmable processor operates in accordance with stored programs of instruction where the programs contain subroutines which correlate with and command measurement sequences within and measurement parameters for the measurement unit.

In an embodiment, where there are N nodes (internal and external) in the circuit under test, the device connection switches include first and second 1-of-N selection switches each for connecting one of the N nodes in the circuit under test to the computing circuit of the measurement unit.

In an embodiment where isolation (guarding) is desired, the device connection switches also include an M-of-N selection switch which connects M of the N nodes in common to the computing circuit.

The 1-of-N and the M-of-N switches are automatically operable to select the desired node connections under command of the device connection switch controller and the programmed processor.

The device connection switches are operated under control of a switch controller. The switch controller includes a plurality of storage units for storing switch control information in response to program commands.

The measurement unit, with the computing circuit selectively interconnected with the circuit under test through the device connection switches, is selectively connected to the exciter circuit to receive selected excitation signals. In response to the excitation signals, the computing circuit provides an measured output signal. A converter circuit is provided for converting the measured output signal to a digital signal representing an in-circuit measurement associated with a component on the device under test. The measurement unit including the exciter circuit, the computing circuit and the converter circuit is commanded to perform predetermined test sequences with commanded test parameters under program control.

The measurement unit is under control of a measurement unit controller which receives and decodes commands from the processor for controlling measurement parameters and measurement sequences of the measurement unit. In a preferred embodiment, the measurement unit controller includes a plurality of interconnected control circuits. A decoder is included for decoding commands from the processor. Exciter control circuitry is included for controlling the exciter circuit of the measurement unit. Reset, transfer and safety control circuitry is included for controlling the basic timing of the measurement unit. Mode control circuitry is included for controlling measurements in five modes and three computing circuit configurations. Measurement scale control circuitry is included for setting the measurement scale of the measurement unit. Measurement timing control circuitry is included for defining measurement timing sequences for measurement unit measurements. Internal data register control circuitry is included for communicating with the processor.

The in-circuit tester includes a program addressable register for storing information concerning a particular test of the measurement unit. For example, the register is addressable for storing the identity of a component or node under test.

The in-circuit tester includes a transfer circuit for transferring the device connection switches for connection to an alternate tester such as a functional tester.

In accordance with the above summary, the present invention achieves the objective of providing an improved tester including an automatic in-circuit tester and method for in-circuit testing of components where the tester is automatically operable under program control and wherein program subroutines are correlated with predetermined tests carried out by the tester.

Additional objects and features of the invention will appear from the following description in which the preferred embodiments of the invention have been set forth in detail in conjunction with the drawings.

BRIEF DESCRIPTION OF THE DRAWINGS

FIG. 2 depicts a schematic representation of the device connection switch controller (DCS CTRL) which forms a part of the in-circuit tester of FIG. 1.

FIG. 3 depicts a schematic representation of the E, F and G device connection switches (DCS) which form part of the in-circuit tester within the FIG. 1 apparatus.

FIG. 4 depicts a schematic representation of the measuring unit (MEAS UNIT) including the exciter circuit, the computing circuit, and the converter circuit of the in-circuit tester within the FIG. 1 apparatus.

FIGS. 5 through 11 depict a schematic representation of the circuits which constitute the measurement unit controller of the in-circuit tester within the FIG. 1 apparatus.

FIG. 5 depicts a schematic representation of the decoder of the measurement unit controller.

FIG. 6 depicts a schematic representation of the exciter circuit control of the measurement unit controller.

FIG. 7 depicts a schematic representation of the reset, transfer and safety control circuitry of the measurement unit controller.

FIG. 8 depicts a schematic representation of the mode control circuitry of the measurement unit controller.

FIG. 9 depicts a schematic representation of the measurement scale selection control circuitry of the measurement unit controller.

FIG. 10 depicts a schematic reresentation of the measurement timing control circuitry of the measurement unit controller.

FIG. 11 depicts a schematic representation of the internal data register control circuitry of the measurement unit controller.

FIG. 12 depicts a schematic representation of the measuring unit of FIG. 4 when connected in the V mode where the excitation signal is voltage and the measured signal is voltage.

FIG. 13 depicts a schematic representation of the measuring unit of FIG. 4 when connected in the Z mode where the excitation signal is current and the measured signal is voltage.

FIG. 14 depicts a schematic representation of the measurement unit of FIG. 4 when connected in the Y mode where the excitation signal is voltage and the measured signal is current.

FIG. 15 depicts a sample circuit to be tested by the method and apparatus of the present invention.

FIG. 16 depicts an electrical schematic representation of an alternate embodiment of the transfer circuit 17 of FIG. 1.

Figure 1:
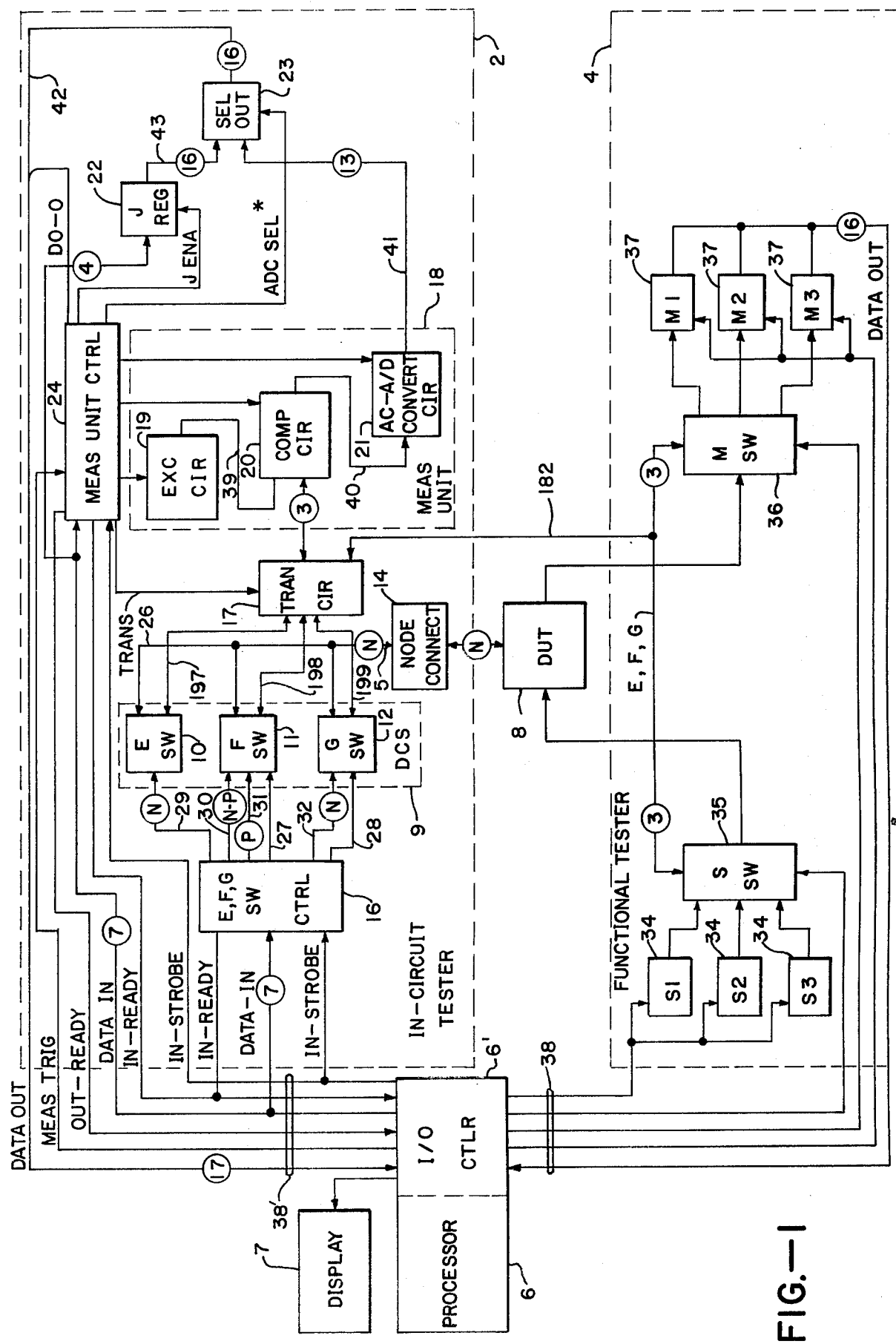
FIG. 1 depicts a schematic block diagram of an in-circuit tester and a functional tester together connected to a programmable processor in accordance with the present invention.

DETAILED DESCRIPTION
OVERALL SYSTEM — FIG. 1

In FIG. 1, the device under test (DUT) 8 includes circuits and components to be tested by the in-circuit tester 2 or by the functional tester 4. The testing of the device under test 8 by the testers 2 and 4 is controlled by a programmable processor 6. The results of the test are output from the processor 6 to any conventional output device such as a conventional display 7.

The processor 6 in a preferred embodiment is the controller of a TESTPAC system manufactured and sold by Zehntel, Incorporated of Concord, Calif. However, the processor 6 can be any conventional processor which functions under program control to output commands. Typically the commands are output through an input/output portion of the controller (I/O CTLR) such as controller 6' in FIG. 1 which operates with an ASCII code. The processor 6 connects to the functional tester 4 through a plurality of data and control lines 38 and to the in-circuit tester 2 through a plurality of data and control lines 38'. The processor communicates with tester 2 or tester 4 by means of a programmed address. For example in the present embodiment, in-circuit tester 2 is assigned address 04 and functional tester 4 is assigned address 09. Any instruction which specifies address 04 will cause processor 6 to communicate with in-circuit tester 2 over lines 38'. Similarly, any instruction which specifies address 09 will cause processor 6 to communicate with functional tester 4 over lines 38.

The functional tester 4 includes a plurality of stimulation sources (S1, S2 and S3) 34 which are selectable one at a time by a source switch (SW) 35. The stimulation sources 34 are conventional signal generators which provide, for example, controlled timing pulses, voltage levels, and other signals of an AC or DC nature.

The switch 35 functions to connect one of the sources 34 to the input terminals of the device under test 8 or to the EFG bus which connects to and from the transfer switch 17 of the in-circuit tester 2. When commanded by the processor 6, an excitation signal is applied to input terminals of the device under test 8 through switch 35. The device under test responsively produces output measurement signals on output terminals. The output terminals are connected as an input to the metering switch (M SW) 36. The metering switch selects, under command of the processor 6, one of the plurality of metering devices (M1, M2 and M3) 37 to receive the measurement signals from the device under test. Switch 36 is also operative under processor control to connect the measurement signals to the EFG bus of in-circuit tester 2. The measured value from one of the connected metering devices 37 is returned to the processor 6 via the 16-bit DATA OUT BUS.

The functional tester 4 and the processor 6 in a preferred embodiment are a TESTPAC system marketed by Zehntel, Incorporated.

In FIG. 1, the in-circuit tester 2 includes a node connector (NODE CONNECT) 14 which connects to N nodes in the device under test 8. In a preferred embodiment, N is equal to from 0 to 1000 (000 to 999). The N nodes which are connected by the node connector 14 include both internal and external nodes. Node connector 14 is a conventional device for making connection to printed circuit boards and is frequently referred to as a "bed-of-nails" fixture. The fixture operates by means of spring-loaded contacts juxtaposed a printed circuit board. The circuit board is clamped to the fixture to make the "nails" contact the nodes, one nail per node. Each of the N nodes from the node collector 14 are connected to the device connection switches (DCS) 9.

The device connection switches 9 include the E switch (E SW) 10, the F switch (F SW) 11 and the G switch (G SW) 12. The connection switches 9 each are connected in common to the N lines from the node connector 14. Each of the switches 9 provides a single line switch output to the transfer circuit (TRANS CIR) which is connected to one or more of the N node lines depending upon the selected or not-selected state of the switches 9. Specifically, the E switch 10 provides the E switch output line 197, the F switch 11 provides the F switch output line 198 and the G switch 12 provides the G switch output line 199. The function of the E, F and G switches is to respectively select one or more of the N node lines 5 as the E, F and G switch outputs 197, 198 and 199.

The switch controller (SW CTRL) 16 provides selection lines to the connection switches 9 for selecting or not-selecting the connection switches. The controller 16 determines which of the N lines from the device under test 8 are connected to the respective E, F and G switch outputs. The switch controller 16 provides N select lines 29 to the E switch 10. One out of N of the lines 29 are selected at any one line.

The switch controller 16 provides N-P selection lines 30, P selection lines 31 and a F-INVERT* line 27 to the F switch 11. The controller 16 functions to select one of the N lines 30 and 31 or to select the N-P lines 30 depending on the state of the F-INVERT* line 27. In a preferred embodiment, P is a non-variable, fixed quantity less than N. Nowever, P can be made program variable.

The switch controller 16 provides N selection lines 32 and the G-UNLATCH* line 28 to the G switch 12. The G-UNLATCH* line 28 functions to unlatch all previously selected (latched) switches in switch 12.

The switch controller 16 is operated by commands from the processor 6 on a 7-bit DATA IN bus. The DATA IN bus is conventional which, in a preferred embodiment, receives data from processor 6 in the American Standard Code for Information Interchange ASCII) format. Data is placed on the DATA IN bus by the processor 6 when a signal on the IN-READY line from the controller 16 is present. Processor 6 signals the presence of information on the DATA IN bus by a signal on the IN-STROBE line input to controller 16.

The switch controller 16 functions, under commands on the DATA IN bus to energize a commanded one of the switch selection lines 27 through 32. The E, F and G switches responsively are closed to select E, F and G switch outputs from the N node lines 5.

The transfer circuit 17 functions to connect the E, F and G switch outputs 197, 198 and 199 from the connection switches 9 either to the computing circuit 20 in the measurement unit 18 or to the functional tester 4. The transfer circuit 17 connects the switch outputs either to the computing circuit 20 in the measurement unit 18 or to the functional tester 4 under control of the 1-bit TRANS line from the measuring unit controller (MEAS UNIT CTRL) 24.

The measurement unit (MEAS UNIT) 18 receives the E, F, G switch outputs from the transfer circuit 17 to connect the device under test 8 to the computing circuit (COMP CIR) 20. The computing circuit 20 thereby becomes connected to the program selected nodes in the device under test. The computing circuit 20 also receives an excitation signal on line 39 from the exciter circuit (EXC CIR) 19. The computing circuit 20 in response to that excitation signal performs a computation on the device under test and forms a measurement signal output on line 40. The measurement signal is input to the AC and analog-to-digital converter (AC-A/D CONVERT CIR) 21. The converting circuit 21 functions to detect and convert the measurement signal on line 40 to digital form on line 41.

The excitation circuit 19, the computing circuit 20, and the converter circuit 21 are responsive to the measurement unit controller 24 to perform a plurality of predetermined tests. The predetermined test involves setting up predetermined measurement conditions and parameters in the measurement unit 18. Thereafter, the measurement unit functions to perform a test sequence for testing the device under test with the present conditions and parameters. The output of the test sequence appears as a digital measurement value on 13-bit bus 41.

The measurement controller (MEAS UNIT CTRL) controls the measurement unit 18 by many signals and lines which are only schematically represented in FIG. 1. The measurement controller 24 is itself controlled by the processor 6 via the 7-bit DATA IN bus. When the controller is ready to receive information on the DATA IN bus, controller 24 provides a signal on the IN-READY line. When processor 6 places command information on the DATA IN bus, it provides a signal on the IN-STROBE line to the controller 24. After predetermined conditions and parameters have been commanded to the controller 24 preparatory to a test sequence, the test sequence is initiated by the processor 6 through a signal on the MEAS TRIG line. After a test sequence has been performed and the results of the measurement are ready to be returned to the processor 6, controller 24 provides a signal on the OUT-READY line. At that time, data from the in-circuit tester 2 is made available on the 16-bit DATA OUT bus.

The bus 42 provides an output from either the measurement bus 41 or from the J register (J REG) 22 via bus 43. The selection of bus 41 or bus 43 is under control of the select out circuit (SEL OUT) 23 which is controlled by the ADC SEL* line from the controller 24. When measurement information is to be output, bus 41 is selected by the circuit 23.

The J register 22 is utilized in connection with the performance of instructions by the processor 6. The J register is utilized to store the identity of components or other circuit information relating to the measurement being made by the measurement unit. Information is loaded into the J register 22 directly from the DATA IN bus under the command of a J ENA line from the controller 24.

The J register 22 is serially loaded with the four low-order bits BIT 0, BIT 1, BIT 2, and BIT 3 of the DATA IN bus under control of a J ENA clock from controller 24. Each of those four lines goes to a separate 4-bit stage of the 16-bit J register. Those sixteen bits appear as outputs on bus 33 for selection by the circuit 23 onto the DATA OUT bus 42.

EFG SWITCH CONTROLLER — FIG. 2

In FIG. 2, the 7-bit DATA IN bus and the timing line IN-STROBE are input to the conventional decoder 51. Decoder 51 develops a plurality of control signals as indicated in FIG. 2 where a + symbol designates a logical OR and the * symbol designates a logical complement. The particular switch of the device connection switches 9 in FIG. 1 which is to be selected at any given time is stored in the flip-flops 55 of the controller of FIG. 2. Under command from the DATA IN bus, decoder 31 is initially operative to clear the flip-flops 55 by application of the CLEAR* signal. In addition to clearing the flip-flops 55, the initial CLEAR* signal clears the digit shift register (D SREG) 56 and the BCD latches (BCD LAT) in the selection circuits 72, 73 and 74. With these elements cleared, the C output from the shift register 56 is a 0 which places an 0 on the K inputs of all the flip-flops 55 except the XA, GA and I flip-flops which receive their K inputs directly from the decoder 51.

Any of the flip-flops 55 having a K input of 0 which thereafter receives a 1 on its J input at a time when the CLOCK signal is present is clocked to store a 1 on the Q output and a 0 on the Q* output.

The E flip-flop 55 becomes set by the E+I signal which is present whenever an E or a I signal is programmed to appear on the DATA IN bus. The E flip-flop 55 through its Q output enables the digit decoders comprising the three NAND gates 57 which decode the outputs from the shift register 56.

With the Q output of the E flip-flop 55 set to a 1, the decoder NAND gates 57 are enabled to decode the output of the register 56 each time a CLOCK signal enables the AND gates 64. The gates 57 sequentially and one at a time clock the 4-bit BCD latches 67, 68 and 69 in response to each step of register 56. Each of latches 67, 68 and 69, when clocked, parallel stores the 4 bits, BIT 0, BIT 1, BIT 2 and BIT 3 from the DATA IN bus. While the 4-bit latches have been selected to define 1000 nodal points (N equal to 1000), any number of latches could be employed to make N any magnitude.

The decoder 70 receives the parallel outputs of the latches 67, 68 and 69 to selectively energize one of the N select lines 29. The energized one of the lines 29 is active as long as the latches 67, 68 and 69 are not cleared or until a new value is loaded from the DATA IN bus.

The F flip-flop 55 is set in the same manner as the E flip-flop 55 whenever decoder 51 detects a programmed F signal or a programmed I signal. The Q output of F flip-flop 55 functions to enable the decoder gates 58 for storage of BCD digits in latches (not shown) in the F selection circuitry (F SEL) 73 in the same manner as the latches described in the E selection circuitry 72. The F selection circuitry 73 is identical to the E selection circuitry 72 except that the decoder in the F selection circuitry 73 has its output divided into two groups. The first group includes the N-P lines 30 and the other group includes the P lines 31. In a preferred embodiment, for economy purposes, the value of N is 1000 and the value of P is 500. The value of P can be made a variable under program control by inserting a gating tree on the output of the F selection circuitry 73 and controlling the size of P by a P out of N decoder. The value of P is then controlled by a register loaded from the DATA IN bus inn the same manner as latches 67, 68 and 69 are loaded.

The I flip-flop 55 is set in the same manner as the E and F flip-flops 55 whenever a 1 is decoded for the I signal connected to the J input of the I flip-flop 55 while both E and F are programmed to be 0. The Q* output of the I flip-flop 55 provides the F-INVERT* signal on line 27. The GA flip-flop 55 stores a 1 on its Q output whenever G on the J input is programmed as 1 provided that the K input is a 0. The K input to GA flip-flop 55 receives the [BIT 7].[(,)+ G]* signal from decoder 51. The K input is, therefore, a 0 whenever BIT 7 is a 0 or when the quantity [(,)+G] is a 1. The Q output of the GA flip-flop 55 functions through NAND gates 59 to enable BCD latches in the G select (G SEL) circuitry 74 in the same manner described in connection with the E selection circuit 72.

The GB flip-flop 55 is set in the same manner as the other flip-flops 55 whenever G is programmed to present a 1 on the J input. The Q* output from the GB flip-flop provides the G-UNLATCH* signal on line 28. The line 28 signal is employed to hold all of the switches selected one at a time by the outputs on lines 32 in the latched condition until the GB flip-flop 55 is cleared or clocked to a 1 on its Q* output.

The XA flip-flop 55 is set when the X line from decoder 51 provides a 1 to the J input whenever the K input is a 0. The K input receives the [X*].[BIT 7] line from decoder 51. The K input to the XA flip-flop 55 is a 0 whenever X is a 1 or BIT 7 of the DATA IN bus is a 0.

In FIG. 2, the digit shift register D SREG) receives a load signal [E+F+I+G+(,)]* line from the decoder 51. Whenever that line is a 0, a 1 is loaded through the L input of the shift register 56 into the A stage whenever a clock signal is provided from NAND gate 65. Gate 65 functions to provide clock signals to shift register 56 provided that XA flip-flop 55 is reset with a 1 on its Q* output. The 1 loaded into shift register 56 occurs on the trailing edge of the first CLOCK signal so that the A output of shift register 56 enables one of the AND gates 64. The enabled one of the gates 64 passes the second CLOCK signal and enables one of the NAND gates 57 to enable one of the BCD latch 67. At the trailing edge of that second CLOCK signal, the L input to shift register 56 goes to 0 to load a 0 into stage A while the 1 in stage A is shifted to stage B. During the third CLOCK signal, the BCD latch 68 is enabled. During the fourth CLOCK signal, the A and B outputs are 0, the C output from shift register 56 is 1 which enables the third BCD latch 69. The 1 is loaded through the L input of shift register 56 at the same time that one of the flip-flops 55 is set.

In FIG. 2, the X latch 52 receives bits BIT 0, ..., BIT 3 from the DATA IN bus and stores them whenever the X store (X STR) command is output from the decoder 51. The contents of latch 52 are decoded in the conventional X decoder (X DEC) 53. The outputs from decoder 53 are utility outputs which can be used for any purpose. For example, the signal sources 34 for the metering units 37 in FIG. 1 may be turned on or off through use of outputs from decoder 53.

Device Connection Switches — FIG. 3

In FIG. 3, the device connection switches 9 of FIG. 1 are shown in detail. The E switch (E SW) 10 includes N read relay switches (R1) 44. The switch 44-1 is shown in detail as typical. The coil 48 is connected to receive one of the N selection lines 29 from the E selection circuitry 72 in FIG. 2. Whenever the selection line to the coil 48 of switch 44-1 is energized, the associated contact 49-1 is closed. When contact 49-1 is closed, the connected one of the N node lines 5 from the node connector 14 of FIG. 1 becomes connected as the E switch output 197. The output 197 is input to the transfer circuit 17 of FIG. 1. Since only one of the N lines 29 is selected at any given time, only one of the N contacts in the E switches 44 is closed at any one time. Accordingly, only one of the N lines 5 becomes connected as the E switch output 197 at any one time. Whenever the selection lines 29 are all returned to logical 0, as occurs when the BCD latches in the selection circuitry 72 of FIG. 2. are cleared, all of the contacts in the E switch relays 44 are open so that none of the lines 5 are connected as the E switch output 197.

In FIG. 3, the F switch (F SW) 11 also includes N relays (R1) 44. The N relays 44 include N contacts for selectively connecting the N lines 5 from the node connector 14 as the F switch output on line 198. The operation of the relays 44 in the F switch is the same as in the E switch.

The relays 44 in the F switch 11 are organized into a first group of N-P which receive the N-P selection lines 30 through N-P EXCLUSIVE-NOR gates 47. The other inputs to the gates 47 are derived from the F-INVERT* line 27.

The P selection lines 31 connect directly to the coil inputs of P relays 44 without connection through EX-CLUSIVE-NOR gates and operate in the same manner as all the relays in the E switch 10.

Whenever the F-INVERT* signal on line 27 is a 1 and one of the N-P lines 30 is selected with a 1, the corresponding relay 44 has its contact closed connecting the connected one of the lines 5 as the F switch output 198. Similarly, whenever one of the P select lines 31 is energized, the connected one of the relays 44 has its contact closed thereby connecting one of the N lines 5 as the F switch output 198. Whenever the F-INVERT* signal on line 27 is 1, the F switch 11 operates as if the EXCLUSIVE-NOR gates 47 were not present so that the F switch 11 is essentially a 1 out of N selector.

Whenever the F-INVERT* signal on line 27 is 0, the selection process in the relays 44 associated with the N-P selection lines 30 is inverted. Specifically, if one of the N-P lines 30 is selected with a 1, then the associated contact in the relay 44 is not closed while all other N-P-1 contacts are closed and connected in common to the F switch output 198. The F switch 11 is therefore a switch for selecting one out of N lines whenever the F-INVERT* signal is a 1 and the F switch 11 is a switch for selecting N-P-1 lines in common whenever the F-INVERT* signal is a 0.

In FIG. 3, the G switch (G SW) 12 includes N relays (R2) 45 which are respectively associated with the N selection lines 32 from the G selection circuitry 74 of FIG. 2. The relay 45-1 is shown as typical of the N relays 45. Relay 45-1 includes a coil 48 and to responsively actuated contacts 77 and 49-2. The contact 49-2 connects one of the N lines 5 as the G switch output 199. The second contact 77 is connected to the G-UNLATCH* line 28 which functions to hold the contacts 77 and 49-2 closed once they have been initially closed by operation of one of the selection lines 32. The second contact 77 in each of the relays 45 allows a plurality of the contacts 49-2 in the R2 relays 45 to be closed simultaneously even though the selection lines 32 are only selected one at a time. The holding of the relays in the latched state occurs whenever the G-UNLATCH* signal on line 28 is a 1. Whenever the signal on line 20 is a 0, all of the relays 48 become deenergized except any relay associated with any energized one of the N selection lines 32. The G switch 12 is, therefore, a M out of N selection switch whenever the G-UNLATCH* signal is a 1. Similarly, the G switch 12 is a 1 out of N selection switch whenever the G-UNLATCH* is a 0.

Measurement Unit — FIG. 4

In FIG. 4, the measurement unit 18 of FIG. 1 is shown in detail. The exciter circuit (EXC CIR) 19 includes a plurality of signal sources including a first oscillator (OSC 1) 80, a second oscillator (OSC 2) 81, the +DC reference (+DC REF) 82, a −DC reference (−DC−REF) 83 and an external oscillator (EXT OSC) 84. The signal sources 80 through 84 are selected one at a time by the source selection circuit (S SEL) 85. Selection circuit 85 is a conventional multiplexor which provides on its output 94 one of its input signals under control of the 3-bit STIM A, STIM B, STIM C line from FIG. 9.

The selected signal on line 94 is provided directly to a multiplying digital-to-analog converter (MPLY DAC) 87 unless inhibited by the inhibiting circuit (INH) 86. Inhibiting circuit 86 is a conventional gate or other switch which is controlled in the conduction state by a 1 from the Q output of the excitation (EXC) flip-flop 90. Whenever asynchronous operation is desired, flip-flop 90 is held in a set state, with a 1 on the Q output, by the ASYN GATE signal input to the set (S) input from FIG. 6. Whenever synchronous operation is desired a SYN GATE signal from FIG. 6 is applied to the reset (R) and D inputs of flip-flop 90. Thereafter, the Q output of flip-flop 90 is 0 until the detector (ZERO DET) 89 provides a clocking signal to produce a 1 on the Q output. The 0 on the Q output of flip-flop 90 inhibits any signal on line 94 from being input to the multiplier 87. The 0 detector 89 is a conventional device for detecting the 0 crossing of the signal on line 94. The 0 detector 89 is used only for synchronous operation during AC excitation.

When a signal is input from line 94 to the multiplier 87, multiplier 87 functions to multiply the magnitude of the input signal from circuit 86 by a program selected multiplication factor. The magnitude of the multiplication factor is controlled by the 10-bit binary BMC signal from FIG. 6. The multiplier 87 is a conventional device which in a preferred embodiment is a 7520 DAC manufactured by Analog Devices Corporation. The output signal from the multiplier 87 is input through the operational amplifier 88 to provide the desired excitation signal on line 39 which is input to the computing circuit 20.

In FIG. 4, the computing circuit (COMP CIR) 20 receives the excitation signals on line 39. Also the computing circuit 20 receives the E, F, and G switch outputs from the device connection switches of FIG. 3 when connected through the transfer circuit 17 of FIG. 1. Circuit 20 produces a measurement signal on output line 40. Circuit 20 is connectable in a number of modes for measurement using one of six W resistors 92. Resistors 92 in a preferred embodiment range from 10 ohms to 1M ohms in decade increments.

The selection of which of the W resistors 92 is utilized in the computing circuit and the selection of the configuration of the computing circuit is under control of a plurality of relay contacts K1 through K11 and K15 through K24. The determination of which of the K contacts are closed is under control of the K selection (K SEL) circuitry 91. Circuitry 91 may typically include a plurality of relay coils which together with the K contacts constitute reed relays. Of course, any selectable switch may be employed. Depending upon the closure of the K contacts in the computing circuit 20, circuits with many variations may be achieved. The three principal modes of operation are the V mode, Z mode, and the Y mode which are schematically represented in simplified form hereafter in FIGS. 12, 13 and 14, respectively.

The contacts K1 through K6 are selectively energized for connecting one of the W resistors 92 into the computing circuit. The selection of which one of the resistors 92 is connected under control of the 6-bit R SEL* bus from FIG. 9.

The K7 contact is utilized under control of the SQUELCH* signal from FIG. 7 to clamp a 100-ohm resistor across and to thereby squelch the amplifier 93.

The K8 contact is utilized to contact a 0.001 microfarad compensating capacitor across the computing amplifier 93 under control of the COMP CAP* signal from FIG. 9.

The K9 and K24 contacts are closed when the computing circuit is in the Y or the Z mode under control of the (Y+Z)* signal from FIG. 9.

The K10 and K21 contacts are closed to connect the computing circuit in the V mode under control of the V* signal from FIG. 9.

The K11 contact is employed to connect the excitation ground (shown in FIG. 4 as three lines) to the computing circuit ground (shown in FIG. 4 as a triangle) under control of the COM GND* signal from FIG. 8.

The K15 contact is employed during DC testing to bypass the charging capacitor 33 under control of the DC* signal from FIG. 9.

The K16 contact is utilized for AC blanking under control of the AC BLANK* signal from FIG. 10.

The K17 contact is utilized during the Z or the V mode under control of the (Z+V)* signal from FIG. 9.

The K18 and K20 contacts are utilized in the Y mode and are closed under control of the Y* signal from FIG. 9.

The K19 contact is utilized in the Z mode and is controlled under control of the Z* signal from FIG. 9.

The K22 contact is normally closed and is opened during the V mode under control of the V signal from FIG. 9.

The K23 contact is utilized to connect the anti-parallel diodes across the computing amplifier 93 under control of the AMP BOUND* signal from FIG. 9.

The signal K9-24 INH from FIG. 10 is utilized to inhibit the closure of any of the contacts which exist from K9 through K24.

In FIG. 4, the converting circuit (CONV CIR) 21 receives the analog output on line 40 from the computing circuit 20 and converts it to a digitally encoded value on bus 41.

The analog input signal on line 40 is connected to the conventional scaling circuit (SCALE) 95 which includes four switches for connecting one at a time one of four scaling resistors in series with the signal on line 40. In this manner, circuit 95 selects a voltage range of 100 millivolts, 1 volt, 10 volts or 100 volts under control of the four input select lines S0 through S3, respectively.

The output from the scaling circuit 95 connects to the full-wave rectifier (FW RECT) 96. The full-wave rectifier 96 is a conventional device which develops a full-wave rectified signal on output line 103. The signal on line 103, for DC measurement, is input directly to selection circuit 98. For AC measurements, signal on line 103 is input through a peak detector (PEAK DET) 97 which has its output connected as an input to the selection circuit 98. The full-wave rectifier 96 has associated with it a polarity detector (POLAR DET) which senses the input signal to the full-wave rectifier 96 and produces an output signal on line 104 which is logical 1 for a negative input signal and a logical 0 for a positive input signal to form the V<0 signal on line 104. The polarity signal on line 104 is input to the selection circuit 98.

The peak detector 97 receives the full-wave rectified signal on line 103 to produce an AC measurement signal which is input to the selector 98. Peak detector 97 initiates a peak detection measurement by a PD RESET signal.

The selection circuit 98 functions to select the AC measurement signal from the peak detector 97 for output on line 105 under control of the AC signal from FIG. 9. Alternatively, the selection circuit 98 selects the DC measurement signal on line 103 from full-wave rectifier 96 for output on line 105. Whenever the DC signal is selected, selection circuit 98 also selects the polarity detector output on line 104 and provides a polarity signal V<0 on line 106.

The output from the selection circuit on line 105 is input directly to the selection circuit 101 and is input to the analog divider (ANALOG DIV) 99. The analog divider provides an output voltage having a magnitude which is proportional to the reciprocal of the magnitude of the voltage on line 105. During a shorthand mode test (R or C), the output from the analog divider is directly proportional to the actual valve of the resistor or capacitor under test. The proportionality constants are different for resistors and capacitors, hence one bias level is used for a capacitor test as selected by the C TEST signal and another is used at other times as selected by a C TEST* signal.

The selector 101 connects the output of the analog divider to the A-to-D converter 102 via line 107 for R or C tests which are performed in shorthand mode under control of the SHORT signal. In longhand mode (Y, Z, or V modes), selector 101 connects the voltage on line 105 as an input to the A-to-D converter under control of the LONG signal. The signal on line 107 is input to an analog-to-digital converter (A/D CONV) 102. Converter 102 is a conventional device for converting a signal on line 107 to a digitally encoded value on 13-bit bus 41. Converter 102 is timed to commence a conversion under control of a ADC START signal from FIG. 10. After completing a conversion, converter 102 provides an output signal ADC COMP* to indicate when the conversion is complete.

While conventional circuitry may be employed within the converter circuit 21 as described a preferred embodiment of a suitable converter is described in the above-identified, cross-referenced application.

Measurement Unit CTRL Decoder — FIG. 5

In FIG. 5, a decoder 110 which receives the 7-bit DATA IN bus and the IN-STROBE line from FIG. 1 is shown. Decoder 110 produces a plurality of control signals as a direct decode of the DATA IN bus in ASCII code. The CLOCK signal is directly energized by the IN-STROBE signal. The identity and function of the control signals from decoder 110 are further defined in the description of FIGS. 6 through 11.

Exciter Circuit Control - FIG. 6

In FIG. 6, the digital register (DAC REG) 114 receives the four bits BIT 0 through BIT 3 of the DATA IN bus from FIG. 5. In this manner, the register 114 is loaded with information for controlling the type and magnitude of stimulation to be provided by the exciter circuit 19 of FIG. 4. Register 114, in a preferred embodiment, includes four 4-bit BCD shift register stages. Each of the stages receives one of the four input lines BIT 0 through BIT 3. Information is shifted into the stages by shift pulses from NAND gate 112. The stages are all cleared under control of a clear signal from NAND gate 113. The high-order bit of each of the four stages in register 114 is output on the 4-bit DAC REG bus 117 to FIG. 9.

Those high-order bits on line 117 are decoded in FIG. 9 to provide the three signals STIM A, STIM B, STIM C which are returned to the FIG. 6 circuitry and to FIG. 4 circuitry to select the type of excitation as discussed in connection with the exciter circuit 39. The 3-bit STIM A, STIM B, STIM C bus from FIG. 9 is input to the FIG. 6 circuitry to energize one of two gating signals. The SYN GATE signal is generated through a NAND gate 118 and an optical isolator (O/I) 120 by the stimulation signals through the inverted output of AND gate 122. NAND gate 118 is energized only when the PD RESET signal and the ACV* signal from FIG. 10 are 1's and the SQUELCH* signal from FIG. 7 is a 1. In a similar manner, the NAND gate 119 receives the non-inverted output from gate 122, with the same control input from FIG. 7 and FIG. 10 to produce through isolator 121, the ASYN GATE signal when DC operation is to be employed. The SYN GATE and ASYN GATE signals from FIG. 6 control the EXC flip-flop 90 in the exciter circuit 39 of FIG. 4 as previously described.

The BCD output of the DAC register 114 is also converted to a binary value in the BCD-to-binary converter (BCD/B CONV) 115 where the 10-bit output bus from converter 115 is connected through the optical isolator (O/I) 115 as the 10-bit bus BMC. The 10-bit bus BMC from FIG. 6 connects to the multiplier 87 in FIG. 4 to select a multiplication factor as previously described.

The stepping of bits into the DAC register 115 is under control of the NAND gate 112 which in turn is controlled by the logically combined decoder outputs from FIG. 5 and a DAC flip-flop 111. Flip-flop 111 is set with a 1 on its Q output (to enable NAND gate 112) by a CLOCK signal whenever gate 123 signifies that an A, R, C or D signal from the decoder of FIG. 5 is present by applying a 1 on the J input of flip-flop 111 when the K input is 0. The K input of flip-flop 111 is controlled by the gate 124 and is 0 whenever ALPHABETICS* is 1 and one of the inputs to gate 123 is 0. Flip-flop 111 is reset with a 0 on the RESET* signal from FIG. 9 and is clocked to 0 on its Q output if the K input is 1 and the J input is 0.

Reset, Transfer and Safety Control — FIG. 7

The basic timing of the measurement unit 18 of FIG. 1 and FIG. 4 is controlled in part by the FIG. 7 circuitry. Prior to the measurement cycle, the decoded commands from FIG. 5 and FIG. 6 are input to establish an initial condition of the measurement unit and the measurement controller. Under program command the decoder of FIG. 5 produces a 0 for 1, the B* signal simultaneously with a CLOCK signal which, after a 55 millisecond delay in the RESET DELAY single-shot 126, provides an output through gate 133. Also, gate 133 provides an output whenever power for the system is turned on as detected by the POWER ON RESET NETWORK 131.

A 0 output from gate 133 is operative to set the transfer flip-flop (TRANS) 127 with a 1 on its Q output. A 1 on the Q output of flip-flop 127 provides a TRANS signal to the transfer circuit 17 of FIG. 1. A 1 on the Q output of flip-flop 127 switches the transfer circuit 17 to connect the switch outputs 197, 198 and 199 for connection to the switches in the functional tester 4 of FIG. 1. Thereafter, whenever a Y, Z, V, A, R, C or D is programmed and detected by the decoder of FIG. 5, the K input of flip-flop 127 is set to a 1 so that on the next CLOCK signal, flip-flop 127 is clocked to produce a 0 on its Q output. The 0 output to the transfer circuit 117 of FIG. 1 causes the switch outputs 197, 198 and 199 to be connected respectively to the inputs 197', 198' and 199' of the computer circuit 20 of FIG. 1.

Each CLOCK signal from the decoder of FIG. 5 causes a SQUELCH flip-flop 130 to be set with a 1 on its Q output and a 0 on its Q* output. A 0 for the SQUELCH* signal from the Q* output of flip-flop 130 is input to the selection circuit 91 of FIG. 4 to close the contact K7 and hold the computing amplifier 93 in an inactive state until flip-flop 130 is clocked to provide a 1 on its Q* output.

Referring to FIG. 7, the measurement cycle commences with a MEAS TRIG signal from FIG. 11 at a time when the ADC SEL signal from FIG. 11 is present. Those signals from FIG. 11 cause the SQUELCH DROP DELAY single-shot 129 to be fired to produce an output after two milliseconds. After the delay in single-shot 129, the SQUELCH flip-flop 130 is clocked to produce a 1 on its Q* output to remove the squelch condition previously present to hold the measuring unit in an inactive state.

The RECONNECT DELAY single-shot 128 receives the Q output from the flip-flop 127 which is a 1 after a 0 B* signal has caused the transfer flip-flop 127 to be set. At that time, when the output from the NAND gate 134 is a 0 at CLOCK time, RECONNECT DELAY single-shot 128 is fired to produce a 25 millisecond delay during which its Q* output is 0. The Q* output from single-shot 128 inhibits, through NAND gate 135, the IN-READY signal for 25 milliseconds. Thereafter, provided the outputs from gate 133 and single-shot 132 are 1's, the IN-READY signal is transmitted to the processor 6 of FIG. 1 allowing the processor to send a command to the measurement unit controller. NAND gate 135 does not provide the IN-READY signal if the SAFETY DELAY single-shot 132 is timing-out for its 2-millisecond period by after being fired by the SAFETY* signal from FIG. 10 and a 0 output from gate 134.

Mode Control — FIG. 8

In FIG. 8, the mode control circuitry of the measurement unit controller 24 is shown in detail. The measurement unit 18 of FIGS. 1 and 4 is commanded to be in one of three configurations, a V mode, a Y mode and a Z mode. The V mode command from the processor is stored in the V flip-flop 137 when the flip-flop has a 1 on its Q output. The Y mode command from the processor is stored in the Y flip-flop 138 when it has a 1 on its Q output. The Z mode occurs when both the V and the Y flip-flops 137 and 138 have 0's on their Q outputs.

The flip-flops 137 and 138 are clocked to a 1 or 0 state by the decoded commands from the decoder of FIG. 5 in a conventional JK flip-flop manner. Specifically, the Y* signal is inverted and input to the J input of flip-flop 138. The V* signal is inverted and input to the J input of the V flip-flop 137. The Z* input is inverted and input to the K inputs of flip-flops 137 and 138.

The H flip-flop 139 is utilized to open and close the common ground contact K11 in the computing circuit 20 of FIG. 4. Whenever the measuring unit is in the V mode, indicated by a 1 on the Q output of flip-flop 137, the H flip-flop 139 is set to a 1 on its Q output by a programmed 0 for the H* signal from FIG. 5. A 1 for the Q output forces the COM GND* signal to a 0 thereby closing the contact K11 in FIG. 4 by operation of the contact selection circuit 91 of FIG. 4.

Whenever the measuring unit is not in the V mode, the Q* output of V flip-flop 137 is a 1 which through NOR gate 148 also forces the COM GND* signal to a 0 thereby holding contact K11 closed. Accordingly, in the V mode, the closure or opening of the contact K11 in FIG. 4 is program controllable by the H* command while in the Y or Z modes K11 is always closed.

In FIG. 8, the multiplier latch (MTLY LAT) 136 functions to store three bits which signify the magnitude and type of measurement to be performed. For resistive inputs, the O*, K*, or M* signals are selected to specify ohms, kilohms, or megohms, respectively. The P*, N*, and U* inputs are selected to specify picofarads, nanofarads or microfarads, respectively. Those inputs are applied through NOR gates 142 to the 3-bit latch 136.

The multiplier latch 136 stores the type and magnitude of measurement and provides on its output three of the five bits for the shorthand mode (SHM) bus. The latch 136 stores the 3 bits output from the NOR gates 142 when a clocking signal is provided by AND gate 143.

The other 2 bits of the 5-bit SHM bus are derived from a decimal point counter (DEC PT CTR) 140. The counter 140 stores a count which specifies the location of the decimal point in a 3-digit number "XXX" where each "X" is any integer from 0 to 9. The decimal point can be in one of four locations, namely .XXX, X.XX, XX.X, or XXX. The location of the decimal point is stored as a count which is counted into the counter 140 through NAND gate 145 whenever the decimal point (DEC PT) flip-flop 141 has a 1 on its Q output. The flip-flop 141 has a 1 on its Q output whenever an R or a C input is commanded concurrently with a NUMERIC input to provide a 0 to the K input and a 1 to the J input. In the absence of an R or c1 command, NAND gate 149 loads counter 140 to a zero count. If no decimal point is programmed, counter 140 stops counting after the last numeric digit is loaded thereby placing the decimal point after the last numeric digit.

The magnitude and type of measurements, specified by the information in latch 136, and the location of the decimal point, specified by the count in counter 140, together form the 5-bit SHM bus which is employed to address the read-only memory 151 in FIG. 9.

Measurement Scale Control — FIG. 9

In FIG. 9, the read-only memory (ROM) 151 functions to produce an output on eight output lines as a function of the 5-bit SHM bus which addresses memory 151. Memory 151 is enabled to provide an output whenever there is a 0 on a Q* of a shorthand (SHORT) flip-flop 152. Flip-flop 152 is set with a 0 on its Q* output by the presence of a R or c1 commanded by the decoder of FIG. 5 and appearing on the J input of flip-flop 152 when its K input is 0 as occurs in the absence of a 1 for Y, Z or V.

The output on line 154 from memory 151 establishes a 0 for the Z* signal to signify the Z mode to the FIG. 4 circuitry. The three output lines 155 from the memory 151 are input to a binary-coded-decimal to decimal (BCD/DEC) converter 156. Converter 156 selects one of the 6-bit R SEL* bus output lines for selecting one of the six measuring resistors (W) 92 in the computing circuit of FIG. 4. The two output lines 158 from memory 151 are input to the meter scale decoder (METER SCALE DEC) 157. Decoder 157 decodes those lines to select one of the four output lines S0* S1* S2* and S3*. The S0 through S3 lines connect to the scale circuit 95 of FIG. 4. The remaining two output lines from memory 151 connect as inputs to the optical isolators (O/I) 147 providing the STIM A and STIM B signals to FIGS. 4 and 6.

Whenever the SHORT flip-flop 152 has a 0 on its Q output, a S register 160 has its 2-bit output functioning as the input to the meter scale decoder 157 in lieu of the output on lines 158 from memory 151. Similarly, the 3-bit output from the W register 159 is input to the converter 156 in lieu of the 3-bit output 155 of memory 151. The W and S registers 159 and 160 are program settable during the longhand mode (flip-flop 152 having a 1 Q* output) for commanding measurement parameters to the measurement unit of FIG. 4. During the shorthand mode (flip-flop 152 having a 1 on its Q output) read-only memory 151 provides preestablished measurement parameters without the need for additional programming. Of course, memory 151 can be a writable read-only memory to allow the preestablished shorthand mode measurement parameters to be changed under program command.

The inputs to the W register are BIT 0, BIT 1 and BIT 2 of the DATA IN bus of FIG. 5. The enabling of an input to the W register 159 is under control of the W flip-flop 161. Flip-flop 161 is set with a program commanded W* signal from the decoder of FIG. 5.

The S register 160 is enabled to store information from BIT 0 and BIT 1 of the DATA IN bus under control of the F flip-flop 162. The S flip-flop 162 is set under program command by the S* signal from the decoder of FIG. 5.

Measurement Timing Control — FIG. 10

In FIG. 10, the MEAS TRIG signal from the processor 6 of FIG. 1 initiates a timing sequence. The MEAS TRIG signal is present for between 1 microsecond and 1 millisecond.

The FIG. 10 circuitry is operable to time the measurement sequence in a plurality of modes. The modes include DC measurement with DC stimulation, AC measurement with AC stimulation, AC measurement with DC stimulation, DC measurement with AC stimulation with retriggering after the first MEAS TRIG signal, and capacitance (C) mode measurements.

The various single-shots and flip-flops in FIG. 10 participate in controlling the different measurement modes in the following way. The ACV single-shot 162 functions during an AC measurement, signified by NAND gate 170 during a V mode, signified by a 0 VFF* signal from FIG. 9, to provide an ACV* 0 output for 25 milliseconds after the leading edge of the MEAS TRIG signal. The ACV* 0 connects from FIG. 10 through logic in FIG. 7, to provide a 0 AC BLANK* signal which connects to the circuitry 91 in computing circuit 20 of FIG. 4 to close contact K16 and thereby allow the charging of the block capacitor 33 for 25 milliseconds. A 0 Q* output from flip-flop 130 also closes contact K16 for the same purpose.

A peak detector reset (PK DET RESET) single-shot 163 has a 2 millisecond time-out which via the line PD RESET functions to reset the peak detector 97 in the converter circuit 21 of FIG. 4. The 2 millisecond time-out of the detector 163 is commenced by gate 172 when an AC measurement is indicated by NAND gate 170 and the ACV single-shot 162 has timed out. Also the PD RESET* signal is propagated to the NAND gate 118 in FIG. 6 to generate, when otherwise proper, the SYN GATE signal which is connected to the reset input of the excitation flip-flop 90 at the termination of the 2 millisecond time-out of single-shot 163. Also after the time-out of the peak detector single-shot 163, the AC2 DELAY single-shot 165 is fired to give a 2 millisecond delay before firing an ADC START single-shot 169. Depending on the type of stimulation as controlled by the FIG. 9 circuitry, an AC delay signal from FIG. 9 may be employed to fire a 15 millisecond AC1 DELAY single-shot 164 for providing a longer delay before firing the ADC single-shot 169.

The ADC START single-shot 169 fires for one microsecond to provide the ADC START signal to the A/D converter 102 in the converting circuit 21 of FIG. 4. During the AC mode, single-shot 169 is fired by the output from the NOR gate 173 while the Q* output of the DC READ single-shot 166 is 1. During the DC mode, the AC input to single-shot 169 from gate 173 is maintained at a 1 so that the single-shot 169 is fired when the Q* output from single-shot 166 returns to a 1 after a 3 millisecond time-out. The single-shot 166 is enabled to be fired during the DC measurement mode through operation of AND gate 171. Gate 171 or gate 170 operate through gate 173 to set MEAS BSY flip-flop 167 with a 1 on its Q output which in turn fires the DC READ flip-flop 166 for a 3 millisecond period. If the DC mode has been selected, the ADC START single-shot 169 is immediately fired. If the AC mode is in progress, then the AC1 or AC2 delays from single-shots 164 or 165 must be waited until the ADC single-shot 169 is fired. The MEAS BSY flip-flop 167 is clocked to a 0 in its Q output whenever a 0 ADC COMB* signal is provided from the A/D converter 102 in FIG. 4.

The SAFE flip-flop 168 is reset by the operation of either NAND gate 170 or NAND gate 171 through gate 173 at the commencement of a DC measurement or an AC measurement. Flip-flop 168 is clocked to a 0 on its Q* output whenever a NEW MODE signal occurs from the FIG. 8 circuitry. With flip-flop 168 with a 0 on its Q* output, the signal K9-K24 INH is 1 thereby holding all of the existing contacts K9 through K24 open to insure that no unintended connections occur while the computing circuit 20 is being changed from one mode to another. When a new mode has occurred, a 0 SAFETY* signal is input to the SAFETY single-shot 132 in FIG. 7 to delay the IN-READY signal which connects to the processor of FIG. 1.

Internal Data Register Control — FIG. 11

In FIG. 11, the T/Q flip-flop 179 is set on program command under control of the T* and Q* signals from the decoder of FIG. 5. Whenever flip-flop 179 is set with a 1 on its Q output, a 1 ADC SEL signal is provided to FIGS. 7 and 10 to enable the measurement sequence to commence. The ADC SEL* signal from the Q* output of flip-flop 179 controls the SEL OUT circuitry 23 in FIG. 1.

The L flip-flop 178 is settable under program control in response to the L* signal from the decoder of FIG. 5. The L flip-flop 178 is utilized for enabling the FLAG flip-flop 177 to store the data on BIT 0 of the DATA IN bus from FIG. 5. The Q output of the FLAG flip-flop 177 is connected through AND gate 80 to provide a bit of information on the DO-0 line which connects to the DATA OUT bus 42 in FIG. 1.

The J flip-flop 176 in FIG. 11 is set under program command by the J* and NUMERICS* signals from the decoder of FIG. 5. Whenever the Q output of flip-flop 176 is a 1, NAND gate 181 is enabled to pass the CLOCK signal under appropriate input conditions of the J* and NUMERICS* signals. When NAND gate 181 passes CLOCK signals, J ENA stepping signals are provided to load the shift register stages of the J register 22 of FIG. 1 as previously described.

V Connection Mode — FIG. 12

In FIG. 12, a simplified schematic relationship is shown to indicate the manner in which the in-circuit tester 2 of FIG. 1 is configured when commanded to be in the V connection mode. The exciter circuit 19 connects through a W resistor in the computing circuit of FIG. 4 through the E switch 10 to a selected node in the device under test 8. The F switch 11 and the G switch 12 each connect a respective selected node in device 8 to the converter 21. The machine ground (triangle) is connected to the excitation ground (three bars) depending upon whether or not the contact K11 is closed or open under program control.

Z Connection Mode — FIG. 13

In FIG. 13, a simplified schematic representation of the manner in which the in-circuit tester connects the device under test 8 in the Z mode and R mode is shown. The exciter circuit 19 connects through a W resistor as an input to the computing amplifier 93. The F switch 11 connects the left node of the in-circuit component C1 of the device under test 8 also as an input to the computing amplifier 93 via switch output 198. The E switch 10 connects the other node of the component C1 to the output of the computing amplifier 93 via switch output 197'. The G switch 12 connects the node between components C3 and C2 to ground via switch output 199'. In this manner, the circuits C3 and C2 are guarded from interfering with the in-circuit measurement of the component C1. The output of the computing amplifier 93 is connected as the measurement signal into the converter 21 along with the ground line. In the Z mode, the excitation ground and the machine ground are the same.

Y Connection Mode — FIG. 14

In FIG. 14, a simplified schematic representation of the manner in which the in-circuit tester 2 is connected in the Y mode and C mode is shown. The circuit under test 8 includes the components C1 through C5. The component C1 is to be in circuit tested. The E switch 10 connects the excitation signal from exciter 19 via line 197' to one node of the C1 component. The F switch 11 connects the other node of the component C1 via line 198' as an input to the computing amplifier 93. The W resistor is connected across the computing amplifier 93. The G switch 12 connects the ground terminal via line 199' to the node between components C3 and C2 and to the node between components C5 and C4. In this manner, the C2, C3 and C4 components are guarded from interfering with the measurement of the C1 component. The output from the computing amplifier 93 and the ground connection are input to the converter 21.

Sample Circuit Under Test — FIG. 15

In FIG. 15, a circuit is shown comprising diodes CR1, CR2 and CR3, transistors Q1 and Q2, capacitor C1, and having nodes 000, 001, 002, . . . , 010.

Processor Program Control

The processor 6 of FIG. 1 may be any general purpose programmed processor. In a preferred embodiment, however, the processor 6 and I/O controller 6' are the Testpac system marketed by Zehntel, Incorporated of Concord, Cal. In that system, the programming symbols employed are defined by the following TABLE I.

The TABLE I symbols are utilized in conjunction with the functional tester 4 in FIG. 1 and the in-circuit tester 2 of FIG. 1. When utilized in conjunction with the in-circuit tester 2, the program includes the additional symbols utilized in connection with Measurement Programming, Switch Programming, and Function Programming.

Measurement Programming

Operating Mode. In order to specify the operating mode, the symbols Z, R, C, Y and V are employed.

The Z symbol specifies the configuration of FIG. 13 in which the voltage of an in-circuit component under test is measured.

The R symbol defines the configuration of FIG. 14 for measuring a resistor value. The R symbol is followed a 3-digit value for specifying the magnitude of the resistor under test.

The C symbol specifies the configuration of FIG. 13 for measuring a capacitor value. The symbol C is followed by a 3-digit value for specifying the capacitance of the capacitor under test.

The Y symbol specifies the configuration of FIG. 14 for measuring current through the component under test.

TABLE I

| Description | Symbol | Purpose |
|---|---|---|
| NON-EXECUTE SYMBOLS: | | |
| START OF TEST | < | Identifies start of test sequence |
| END OF TEST | > | Identifies end of test sequence |
| BEGINNING OF FIELD | ( | Allows setup data entry |
| DELAY | : | Produces time delay |
| TEXT - START | " | Beginning of text message |

TABLE I-continued

| Description | Symbol | Purpose |
|---|---|---|
| - STOP | " | End of text message |
| END OF SKIP | $ | End of skipped portion |
| SET OR CLEAR SWITCH | , | "Set" if switch No. preceded by "S" "Clear" if switch No. preceded by "C" |
| FIND SUBROUTINE | ; | Jump to subroutine & store return address |
| RETURN FROM SUBROUTINE | * | Return to point in program where the last subroutine was called |
| GO TO | % | Go to title stored in Field (98 |
| EXECUTE SYMBOLS: | | |
| PROCEED TO NEXT STEP | ) | Allows test to proceed automatically regardless of result |
| STOP | / | Causes test to stop regardless of result |
| STOP ON FAILURE | ? | Allows operator action on failure |
| STOP & RECYCLE | # | Allows adjustment |
| SKIP ON ACCEPT | & | Allows diagnostic message when test step fails |
| SKIP ON FAIL | ! | Allows test steps to be skipped when test step fails |

The V symbol specifies the configuration of FIG. 12 for measuring output voltage.

There are three basic operating configurations as indicated in FIGS. 12, 13 and 14 and there are five basic operating modes.

Program Excitation. The symbol D is utilized to specify DC excitation. The symbol D may be followed by any value from +000 to +999 indicating any value between +0.00 volts to +9.99 volts or may be followed by −000 to −999 indicating any value from −0.00 volts to −9.99 volts.

The symbol A designates AC excitation. The symbol A is followed by a 1 designating a first frequency, for example 159.15 Hz or by a symbol 2 indicating a second frequency, for example 1591.5 Hz. The combined symbols A1 or A2 are followed by any three digits between 000 and 999 specifying a peak-to-peak value of between 0.00 volts to 9.99 volts.

Program Resistor. The symbols W1, W2, . . . , W6 are utilized to specify one of the six W resistors 92 in the computing circuit 20 of FIG. 4. The symbols W1, . . . , W6 specify resistive values $10^1$ ohms, . . . , $10^6$ ohms, respectively.

Read-Out Measurement Scale. The symbols S0, S1, S2, and S3 are utilized to control the scaling of the scale circuit 95 in the converter circuit 21 of FIG. 4. The full scale range is specified as follows: S0 indicates 0 to 9.99 volts, S1 indicates 0 to 9.99 volts, S2 indicates 0 to 999 millivolts, and S3 indicates 0 to 99.9 millivolts.

R Mode Multiplier. The symbols O, K, and M are utilized following a 3-digit component value which in turn follows an operating mode symbol R. The symbol O indicates an ohmic multiplier of $10^0$. The symbol K indicates an ohmic multiplication of $10^3$. The symbol M indicates an ohmic multiplier of $10^6$.

C Mode Multiplier. The symbols U, N and P are utilized following a 3-digit component value which in turn follows an operating mode symbol C. The symbol U specifies microfarads and is a $10^{-6}$ multiplier. The symbol N specifies nanofarads and is a $10^{-9}$ multiplier. The symbol P specifies picofarads and is a $10^{-12}$ multiplier.

Switch Programming

The device connection switches 9 in FIG. 1 and other connection functions are performed under program control using the symbols E, F, G, I and X.

The symbol E specifies that the E switch 10 is selected to connect a node in the device under test 8 to the E switch output 197. The E symbol is followed by a digit address which specifies one out of a thousand possible nodes from 0000 to 9999. In the present case the E switch is a 1 of the N selection switch where N is 1,000. Of course, N can be made any value by appropriate addition or deletion of circuits for a fewer or greater number of address digits after the E symbol.

The F symbol is utilized to designate the F switch 11. The F symbol is followed by a 3-digit node address which specifies one of N nodes to be connected to the F switch output 198.

The G symbol is utilized to designate selection by the G switch 12. The G symbol is followed by one or more 3-digit node addresses. Each 3-digit node address following the G symbol specifies a different one of the nodes on the device under test 8 which is to be connected in common to the G switch output 199. G switch 12 therefore makes an M out of N selection. N is 1,000 in a preferred embodiment and M is any number of 3-digit addresses following a G symbol where M must be less than N.

The I symbol is utilized to specify the connection of one node to the E switch 10 output 197 and the connection of all other N-P nodes in common to the F switch output 198. The one node which is connected to the E switch output 197 is specified by a 3-digit node address following the I symbol.

The X symbol is utilized to specify single digit addresses in an X latch 52 in the switch controller of FIG. 2. The X latch contents can be decoded in decoder 53 for any utility purpose desired. For example, the excitation sources 80 through 83 in the exciter circuit 19 of FIG. 4 may have their power turned on or off by means of a connection from the X decoder 53 to appropriate on/off switches (not shown).

Function Programming

Additional functions are programmed with the symbols L, J, H, T, Q, and B.

The L symbol is utilized to set the L latch 178 when the FLAG flip-flop 177 in FIG. 11 designates a failed test. The indication in the flip-flop 177 of a failed test allows programming examination of failures at a later time.

The J symbol is utilized to set the flip-flop 176 in FIG. 11 for inputting information into the J register 22 of the in-circuit tester 2 of FIG. 1.

The J symbol is followed by a 4-digit number to be stored in the J register 22.

The H symbol is utilized during the V mode to set the H flip-flop 139 in FIG. 9 and cause closure of the common ground contact K11 in the computing circuit 20 of FIG. 4.

MERICS* as a 0, thereby enabling the NAND gate 181 in FIG. 11 to load the 01 value into the J register 22.

TABLE II

| | | |
|---|---|---|
| S1 | <(001 | |
| S2 | (04J01I001(98S; | |
| S3 | (04J02I002; | |
| S4 | (04J03I003; | |
| S5 | (04J04I004; | |
| S6 | (04J05I005; | |
| S7 | (04J06I006; | SHORTS TEST |
| S8 | (04J07I007; | |
| S9 | (04J08I008; | |
| S10 | (04J09I009; | |
| S11 | (04J10I010; | |
| S12 | (04E000F002J01(98D; | |
| S13 | (04E008F009J02; | DIODE TESTS |
| S14 | (04E009F003J03; | |
| S15 | (04E005F002G001,003,004J01(98Q; | |
| S16 | (04E004G001,003.005; | TRANSISTOR TESTS |
| S17 | (04E008F005G001,003.006,007J02; | |
| S18 | (04E007G001,003,006,008; | |
| S19 | (04E002F001J01R10.0K(98R; | |
| S20 | (04E003F002G005J02R33.0K; | RESISTOR TESTS |
| S21 | (04E006F004G002,005J03R1.20K; | |
| S22 | (04G005,008J04R8200; | |
| S23 | (04E007F010J01C50.0N(98C; | CAPACITOR TEST |
| S24 | >, | |
| S25 | (99S(04ZD+010W2S3(019999(020500&(19"NODE"(98N;(19"SHORT"$(98S* | |
| S26 | (99D(98F;&(98A;$(98J;&(98A;$(98D* | |
| S27 | (99F(010900(020650(04ZD+100W2S3* | |
| S28 | (99J(010100(020000(04YD+300W4S2* | SUBROUTINES |
| S29 | (99Q(98F;&(98B;$(98J;&(98B;$(98Q* | |
| S30 | (99R(010110(020090&(19"R"(98N;$(98R* | |
| S31 | (99C(010180(020080&(19"C"(98N;$* | |
| S32 | (99A(19"CR"(98N;* | |
| S33 | (99B(19"Q"(98N;* | |
| S34 | (99N(04T(90(190011)* | |
| S35 | > | |

The T symbol is utilized to set the T/Q flip-flop 179 in FIG. 11 to cause the selection out-circuitry 23 of FIG. 1 to select the contents of the J register 22 as the output on the DATA OUT bus 42.

The Q symbol is utilized to set the T/Q flip-flop 179 in FIG. 11 after it has been reset by the T symbol thereby returning the select out circuitry 23 to place the converter bus 41 output on the DATA OUT bus 42.

The B symbol is utilized to fire the singleshot 126 in FIG. 7 and thereby set the transfer flip-flop 127 to cause the transfer circuit 17 in FIG. 1 to shift the device connection switch outputs to the functional tester 4 rather than to the computing circuit 20.

Programmed Operation

In order to test the sample device under test of FIG. 15, the program presented in the following TABLE II is employed. In TABLE II, there are 35 steps, S1 through S35. Each time processor 6 completes a step, signified by ";" symbol, a program step counter in processor 6 is incremented by one to the next step address. In S1 the symbol "<" specifies the start of the test sequence and the "(" indicates that the setup data for the test identified as 001 should be entered. For the present example, the test 001 commences at step S2. In step S2, the "(" signifies the setup of controller 6' to communicate with test equipment which is identified by the code 04. The I/O controller 6' recognizes the 04 code to call the in-circuit tester 2 of FIG. 1 and direct all commands and detect all returned signals over lines 38'.

In step S2, the J symbol causes the J flip-flop 176 in FIG. 11 to be set enabling the J register 22 to be loaded from the DATA IN bus. The 01 symbol following the J symbol causes the decoder of FIG. 5 to produce NU- That value in the J register specifies that the first node, 01, is the one under test.

In step 2, the I is utilized by the decoder in FIG. 2 to set the I flip-flop 55 in FIG. 2. With the I flip-flop 55 storing a 0 on its Q* output, the F-INVERT* signal of line 27 is input to the F switch 11. Decoder 51 of FIG. 2 also outputs a 1 for the E+I and F+I signals thereby setting the E and F flip-flops 55. With the B, F and I flip-flops 55 of FIG. 2 set, the latches in the E selection and F selection circuits 72 and 73 are ready to receive the three digits following the I symbol in the S2 step. The three digits are 001 which are loaded into BCD latches 67, 68 and 69, respectively of the E selection circuitry 72 and simultaneously into corresponding latches of the F selection circuitry 73. The 001 is loaded via the DATA IN bus by sequential stepping of the shift register 56 all in the manner previously described in connection with FIG. 2.

With the latches in selection circuits 72 and 73 appropriately loaded with the 001 value, decoder 70 enables one of the N outputs of bus 29. The one enabled is the one associated with node 001 in the circuit under test of FIG. 15. At the same time, the F selection circuitry 73 also enables the one of the N-P lines 30 which is also associated with node 001 in the FIG. 15 circuit. In FIG. 3, because of the 0 for the F-INVERT* signal, the EXCLUSIVE-NOR gates 47 function to close the contacts in all of the connected relays 44 except that contact associated with the enabled one of the lines 30, that is, the contact connected to node 001. Therefore, the F switch 11 of FIG. 3 functions to connect in common all of the nodes from 002 through 0010 of the FIG. 15 circuit.

In step S2, the symbol ( following the 001 number commands a search for a subroutine located at an address one greater than 98 and identified by S. The ; symbol causes the processor to jump to 99S which is located in step S25 of TABLE II, and to store the return address.

In step S25, the symbol (99S commands that data will be setup for the shorts (S) subroutine. The symbol (04 specifies the calling of the in-circuit tester 2 of FIG. 1 for setup data. The symbol Z specifies the Z mode causing the measurement unit to be configurated in the FIG. 13 manner. The D symbol indicates DC excitation. The +010 symbols indicate that the DC excitation is to be +10 volts. The W2 symbol indicates selection of the W2 resistor in the computing circuit which is equal to 100 ohms. The S3 symbol designates a measurement scale, in the scaler 95 of FIG. 4, in the 100 volt range. The (01 symbol designates that the high-order limit will follow. The symbol 9999 designates the high-order limit which, because of the S3 symbol, is 99.99 volts. The (02 symbol designates that the following number is the low-order limit. Because of the S3 symbol, the following number 0500 is 05.00 volts. At this point, with all setup information commanded to the in-circuit tester, the processor outputs a MEAS TRIG signal which commences a measurement sequence. The "&" causes the program to skip forward to the "$" if no short is detected, that is, if the detected signal from converter 102 on bus 41 is between the high and low limits of 99.99 and 5.00 volts. The actual measured value on bus 41 is communicated directly to the DATA OUT bus 42 through selection circuit 23 and is compared with the high and low limits by the processor. Assuming no short, the next code "(90S*" commands the program to return to step 3 of the program. Steps S3 through S11 are executed in the same manner as step S2 with a branch to the short subroutine of step S25 at each symbol ;.

In step S25, if a short is detected at the & then the display 7 of FIG. 1 is called by the command (19 and the word "NODE" is displayed by display 7. Thereafter, the display subroutine is called by the symbol (98 N and the program jumps to S34 on the ; command. The S34 subroutine functions to set the T/Q flip-flop 179 in FIG. 11 to enable the output from the J register 22. The J register stores the particular node under test and causes it to be gated to the processor 6 and written by the display 7 after the word NODE. The * at the end of step S34 returns the program to the S25 step where the notation (19 causes the word "SHORT" to be displayed. Accordingly, for a node 01 short, display 7 displays NODE 01 SHORT. Thereafter, the program returns via the commands (98S* to perform the next short test (step 3 if step 2 was the last performed) as previously indicated.

After the S11 step, the program commences step S12 to perform a diode test. The three diodes are tested in steps S12, S13 and S14, respectively, where at the end of each step the diode subroutine is called by the command (98D. The diode subroutine appears in step S26 where the forward drop voltage and the reverse leakage current of the diodes CR1, CR2, CR3 are tested.

In steps S15 and S16, the emitter/base and collector/base junctions of transistor Q1 are tested for forward drop voltage and reverse leakage current. In steps S17 and S18, the same parameters are tested for transistor Q2.

In steps S19 through S22, the resistors R1 through R4, respectively, are tested for ±10 percent tolerance.

In step S23, the capacitance C1 is tested for ±80 percent of its stated value of 50 nanofarads.

In step S24, the end of the test sequence for the circuit of FIG. 15 is indicated.

In steps S25 through S34, the subroutines utilized for testing the FIG. 15 circuit are listed. The S subroutine is for short test, the D for diode test, the F for junction voltage test, the J for junction reverse leakage test, the Q for transistor test, the R for resistor test, the C for capacitor test, the A for failed diode display, the B for failed transistor display, the N for display of component number.

In FIG. 16, an alternate embodiment of the transfer circuit 17 of FIG. 1 is shown. In FIG. 16, the three input lines 197, 198 and 199 from the device connection switches 9 of FIG. 1 are connected by 3-pole switch TS in the shown position to the lines 197', 198' and 199' respectively, of the computing circuit 20 of the measurement unit of FIG. 1. When the transfer switch TS is thrown to the phantom position, lines 197, 198 and 199 are connected to the E, F and the G lines, respectively, of the functional tester 4. The position of the switch TS is controlled through a relay by the TRANS signal from the measurement unit controller 24 of FIG. 1 as previously described. The operation of the transfer switch TS in FIG. 16 is identical to the operation of transfer circuit 17 in FIG. 1 with the following exceptions.

In FIG. 16, an X switch 214 is located in the output line 199 from the G switch 12 of FIG. 1. In the closed position, switch 214 connects line 199 to the 3-pole transfer switch TS so that in this position, the operation is the same as if no switch 214 were present. In the phantom position, switch 214 disconnects line 199 from switch TS and connects it directly to the G line which connects to the functional tester 4 in FIG. 1. The control of the position of the switch 214 is by a coil which is energized under control of an X1 signal. The X1 signal is derived from the X latch (X LAT) 52 and the X decoder (X DEC) 53 in the switch controller of FIG. 2. As previously explained, the X latch 52 is loaded under program control so that switch 214 is actuated under program control.

An example of the use of the X switch 214 occurs with switch 214 in the phantom position and switch TS in the shown position. Under these conditions, the E and F switch outputs on lines 197 and 198 are connected to the lines 197' and 198', respectively, as inputs to the computing circuit. However, the G switch output on line 199 does not connect to line 199' in the computing circuit. Rather, the G switch output line 199 connects to the G line of the functional tester 4. In a typical example, the G line in the functional tester 4 is connected through the S switch of FIG. 1 to one of the sources 34. In this manner, a functional tester source is utilized to supply an excitation signal to one or more nodes of the device under test through the G switch 12 of FIG. 1. At the same time, the E and the F switches 10 and 11 select the measurement points which provide an input to the computing circuit 20 which in turn performs a measurement.

As another typical example, the G line, connected through the phantom terminal of switch 214 to line 199, is connected directly to ground (or other voltage level representing a logical 0). When connected to a ground, a logical 0 is applied through the G switch 12 to one or more nodes. In this manner, the device under test receives a digital pattern of 0's at nodes selected by the G switch 12. At the same time, the E and F switches connect an output signal to the measurement unit in the manner previously described.

While the above examples utilize an X switch in the G switch line 199, program controllable X switches, like switch 214, can be used in connection with any of the input and output lines of the transfer switch TS. For example, where it is desired to connect an output signal from the device under test 8 through the M switches 36 to a metering unit 37, an X switch like switch 214 can be inserted in the line 197 for connecting line 197 to the E line of functional tester 4.

While the invention has been particularly shown and described with reference to preferred embodiments thereof it will be understood by those skilled in the art that various changes in form and details may be made therein without departing from the spirit and scope of the invention.

What is claimed is:

1. A testing apparatus for testing electrical properties of a circuit under test formed by a plurality of components interconnected at nodes comprising,
   a plurality of selectable connection switches having switch outputs for connection to selected nodes of the circuit under test,
   connection switch controller means for controlling said connection switches to connect said switch outputs to said selected nodes,
   controllable measurement unit means connected to receive said switch outputs for measuring electrical properties of the circuit under test with predetermined tests,
   measurement unit controller means for controlling said measurement unit means to perform predetermined tests,
   program controlled processor means for processing a program of instructions, including subroutines of instructions correlated to predetermined tests in said measurement unit, said processor connected to said connection switch controller to cause said switch outputs to be connected to said selected nodes and said processor connected to said measuring unit controller for controlling said measurement unit to perform a selected one of the predetermined tests in accordance with a correlated subroutine.

2. The apparatus of claim 1 wherein said circuit under test includes N nodes, wherein each of said connection switches includes N lines connected to said N codes, and wherein at least two of said connection switches each includes means for selecting one of said N lines as one of said switch outputs.

3. The apparatus of claim 1 wherein said circuit under test includes N nodes, wherein each of said connection switches includes N lines connected to said N nodes, wherein at least one of said connection switches includes means for selecting one of said N lines as one of said switch outputs and wherein at least one of said selection switches includes means for connecting (N-1) of said N lines in common as one of said switch outputs.

4. The apparatus of claim 1 wherein said circuit under test includes N nodes, wherein each of said connection switches includes N lines connected to said N nodes, wherein at least one of said connection switches includes means for selecting one of said N lines as one of said switch outputs, and wherein at least one of said connection switches includes means for selecting (N-P-1) of said N lines in common as one of said switch outputs where P is an integer less than N.

5. The apparatus of claim 1 wherein said circuit under test includes N nodes, wherein each of said connection switches includes N lines connected to said N nodes, and wherein said connection switches include,
   a first switch for selecting one of said N lines as one of said switch outputs,
   a second switch for selecting one of said N lines as one of said switch outputs,
   a third switch for selecting M of said N lines in common as one of said switch outputs, where M is any integer less than N.

6. The apparatus of claim 1 including a functional tester connected to said processor means for performing functional tests on said circuit under test, said functional tester comprising,
   a plurality of program selectable signal sources for providing excitation signals under program control,
   first switch means for connecting a selected one of said signal sources to one or more nodes of said circuit under test,
   a plurality of selectable measuring devices selectable under program control for measuring signals in said circuit under test in response to an excitation signal provided by the selected one of said signal sources,
   second program selectable switch means for connecting output nodes from said circuit under test to said selected one of said measurement devices.

7. The apparatus of claim 6 including transfer circuit means for transferring, under program control said switch output from said measuring unit means to said functional tester.

8. The apparatus of claim 1 wherein said measurement unit means includes exciter circuit means having a plurality of excitation sources for providing excitation signals for exciting said circuit under test and includes means for selecting one of said sources under program control.

9. The apparatus of claim 8 wherein said sources include an AC source for providing an AC excitation signal and a DC source for providing a DC excitation signal and wherein said exciter circuit means includes a digital multiplier for multiplying a selected one of said excitation signals by a program commanded digital value.

10. The apparatus of claim 1 wherein said measuring unit means includes a signal source for providing an excitation signal and a multiplying digital-to-analog converter connected to multiply said excitation signal by a quantity specified by a digital input and wherein said measurement unit controller means includes means for providing said digital input under program control.

11. The apparatus of claim 10 including inhibit means for selectively inhibiting said excitation signal from said digital-to-analog converter until a zero crossing of said excitation signal occurs and zero detection means for detecting zero crossing of said excitation signal.

12. The apparatus of claim 1 wherein said measurement unit means includes an excitation means for providing excitation signals under program control, includes computing circuit means connected under program control to said circuit under test by said device connection switches and responsive to said excitation signal to provide a measurement signal, and includes converter means for converting said measurement signal to a digital representation under program control.

13. The apparatus of claim 12 wherein said computing circuit means includes at least one computing resistor, a computing amplifier and a plurality of selectable configuration switches for connecting under program control and computing resistor, said computing amplifier and said switch outputs of said connection switches in a plurality of connection modes.

14. The apparatus of claim 13 including a plurality of computing resistors and a plurality of associated resistor switches selectable one at a time under program control for selecting the magnitude of the computation to be performed by said computing circuit.

15. The apparatus of claim 13 wherein said device connection switches include a first switch, a second switch and a third switch, and wherein said computing circuit means includes,
   means for connecting said circuit under test in a first mode including means to connect the switch output from said first switch in series with said computing resistor to connect said excitation means to said circuit under test and including means to connect the switch outputs from said second and third switches to said converter,
   means for connecting said circuit under test in a second mode including means for connecting said computing resistor between said excitation means and said computing amplifier, including means for connecting the switch output from said first and second switches to the input and output of said computing amplifier, respectively, whereby a component in said circuit under test is connected under program control across the input and output of said computing amplifier, and including means for connecting the switch output from said third switch to ground whereby components in said circuit under test are isolated,
   means for connecting said circuit under test in a third mode including means for connecting the switch output from said first switch to said excitation means whereby said first switch under program control connects a first node of a component in said circuit under test to said excitation means, including means for connecting the switch output from said second switch as an input to said computing amplifier whereby said second switch under program control connects a second node of said component under test as an input to said computing amplifier, including means for connecting said computing resistor between the input and output of said computing amplifier, including means for connecting the switch output from said third switch to ground whereby components in said circuit under test are isolated, and including means for connecting said computing amplifier to said converter.

16. The apparatus of claim 12 wherein said excitation means is referenced to a first ground and said converter means is referenced to a second ground so that the excitation means is floated with respect to said measurement unit means and wherein said measurement unit means includes means, under program control, for connecting said first and second grounds in common.

17. The apparatus of claim 12 wherein said converter circuit means includes scaling means operable under program control for scaling said measurement signal, includes a fullwave rectifier for rectifying the scaled measurement signal and includes an analog-to-digital converter for converting the scaled and rectified measurement signal to a digital value.

18. The apparatus of claim 1 including register means, accessible under program control by said processor means, for storing information relating to the current test being performed by the measurement unit means.

19. The apparatus of claim 18 including selection means for selecting an output from either said register means or from said measurement unit means to provide a data input to said processor means.

20. The apparatus of claim 19 including flag store means accessible under program control by said processor means for storing a flag bit to signify when an output from said measurement unit means does or does not fall within limits stored by said processor means.

21. An apparatus for the in-circuit measuring of electrical properties of components connected in an electrical circuit comprising,
   program commanded connection means for making electrical connection to nodes of a selected component,
   program commanded exciter means for providing a selected excitation signal,
   program commanded computing means connected to said selected component and responsive to said excitation signal to provide a measurement signal,
   program commanded converter means responsive to said measurement signal to provide an output proportional to the electrical property being measured,
   processor means for processing stored instructions for commanding said connection, exciter, computing and converter means; said processor means operable during the execution of said instructions to call subroutines for commanding said computing means and said converter means as a function of the type of electrical property under test for said selected component.

22. A tester apparatus for testing for shorts in a circuit under test formed by a plurality of components interconnected at N nodes comprising,
   a plurality of selectable connection switches having switch outputs for connection to selected nodes of the circuit under test, said connection switches including a first connection switch having means for selecting one of said N nodes as a first one of said switch outputs, and including a second connection switch having means for selecting (N-P-1) of said N nodes in common as a second one of said switch outputs where P is an integer less than N,
   connection switch controller means for controlling said connection switches to connect said switch outputs to said selected nodes,
   controllable measurement unit means connected to receive said switch outputs for measuring the resistance between said first one and said second one of said switch outputs as shorts tests,
   measurement unit controller means for controlling said measurement unit means to perform said shorts test,
   program controlled processor means for processing a program of instructions, including a shorts subroutine for commanding a shorts tests, said processor connected to said connection switch controller to cause said switch outputs to be connected to said selected nodes and said processor connected to said measuring unit controller for controlling said measurement unit to perform said shorts test in accordance with said shorts subroutine.

23. In a testing apparatus for the in-circuit measuring of electrical properties of components connected in an electrical circuit, the method comprising the steps of, connecting, under program command, nodes of a selected component to a measurement unit, exciting, under program command, said selected component and said measurement unit to provide a measurement signal unique to an electrical property of said selected component, converting, under program command, said measurement signal to provide an output signal proportional to the electrical property being measured, processing stored instructions for commanding said connecting step, said exciting step, and said converting step; said processing including the execution of a subroutine as a function of the type of electrical property being measured for said selected component, repeating said connecting step, said exciting step, said converting step and said processing step for a number of selected components in said electrical circuit.

24. In the method of claim 23, the additional step of connecting selected nodes of said circuit in common to isolate components from said selected component during said exciting and said converting steps.

25. A testing apparatus for testing electrical properties of an electrical circuit formed by a plurality of components interconnected at nodes comprising, a program controllable in-circuit tester including selectable connection switches having switch outputs for connecting selected nodes of a selected component of said circuit to a program controllable measurement unit operable to measure electrical properties of said selected component, a program controllable functional tester including selectable signal sources for providing excitation signals to said circuit to produce measurement signals; including selectable measuring devices for measuring said measurement signals and including switch means for connecting selected ones of said signal sources and said measuring devices to said circuit, program controllable transfer switch means for connecting selected ones of said switch outputs in said in-circuit tester to said switch means in said functional tester whereby said in-circuit tester and said functional tester are interactively connected for concurrent operation, processor means for processing instructions for controlling said in-circuit tester, said functional tester and said transfer switch means.

* * * * *